US010163519B2

(12) United States Patent
Ikeda et al.

(10) Patent No.: US 10,163,519 B2
(45) Date of Patent: Dec. 25, 2018

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Takayuki Ikeda, Atsugi (JP); Seiichi Yoneda, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/804,295

(22) Filed: Nov. 6, 2017

(65) Prior Publication Data

US 2018/0130539 A1    May 10, 2018

(30) Foreign Application Priority Data

Nov. 10, 2016  (JP) ................................. 2016-219834
Feb. 23, 2017  (JP) ................................. 2017-032226
Jun. 16, 2017  (JP) ................................. 2017-118566

(51) Int. Cl.
  *G11C 16/28*    (2006.01)
  *G11C 16/10*    (2006.01)
  (Continued)

(52) U.S. Cl.
  CPC ............... *G11C 16/28* (2013.01); *G11C 7/16* (2013.01); *G11C 8/14* (2013.01); *G11C 11/405* (2013.01);
  (Continued)

(58) Field of Classification Search
  CPC .. G11C 16/28; G11C 7/16; G11C 8/14; G11C 11/405
  (Continued)

(56) References Cited

U.S. PATENT DOCUMENTS 9,164,526 B2 * 10/2015 Pan ..................... G11C 5/145
2011/0116310 A1    5/2011 Yamazaki et al.
(Continued)

FOREIGN PATENT DOCUMENTS

JP    2011-123986 A    6/2011
JP    2016-105343 A    6/2016

OTHER PUBLICATIONS

International Search Report (Application No. PCT/IB2017/056802) dated Jan. 9, 2018.
(Continued)

*Primary Examiner* — Harry W Byrne
(74) *Attorney, Agent, or Firm* — Robinson Intellectual Property Law Office; Eric J. Robinson

(57) ABSTRACT

A highly reliable semiconductor device is provided. A memory cell includes a first transistor and a second transistor. One of a source and a drain of the first transistor is electrically connected to a gate of the second transistor. The first transistor is configured to hold charge corresponding to first data retained in the memory cell when turned off. The data writing circuit is configured to write the first data and correction data to the memory cell. The data reading circuit is configured to read a first voltage value corresponding to the first data, read a second voltage value corresponding to the correction data written to the memory cell, convert a voltage value that is equivalent to a difference between the first voltage value and the second voltage value into corrected first data, and output the corrected first data to the data writing circuit.

15 Claims, 20 Drawing Sheets

(51) Int. Cl.

| | | |
|---|---|---|
| *H01L 23/522* | (2006.01) | |
| *H01L 27/105* | (2006.01) | |
| *H01L 27/12* | (2006.01) | |
| *G11C 7/16* | (2006.01) | |
| *G11C 8/14* | (2006.01) | |
| *G11C 11/405* | (2006.01) | |
| *G11C 11/408* | (2006.01) | |
| *G11C 11/4091* | (2006.01) | |
| *G11C 11/4096* | (2006.01) | |
| *G11C 11/56* | (2006.01) | |
| *H01L 29/78* | (2006.01) | |
| *H01L 29/786* | (2006.01) | |

(52) U.S. Cl.
CPC ...... *G11C 11/4087* (2013.01); *G11C 11/4091* (2013.01); *G11C 11/4096* (2013.01); *G11C 11/565* (2013.01); *G11C 16/10* (2013.01); *H01L 23/5223* (2013.01); *H01L 23/5226* (2013.01); *H01L 27/1052* (2013.01); *H01L 27/1207* (2013.01); *H01L 29/7851* (2013.01); *H01L 29/7869* (2013.01)

(58) Field of Classification Search
USPC .......................................... 365/185.01–185.33
See application file for complete search history.

(56) References Cited

U.S. PATENT DOCUMENTS

| | | |
|---|---|---|
| 2011/0122670 A1 | 5/2011 | Yamazaki et al. |
| 2011/0134683 A1 | 6/2011 | Yamazaki et al. |
| 2012/0032164 A1 | 2/2012 | Ohnuki |
| 2012/0033488 A1 | 2/2012 | Nagatsuka et al. |
| 2012/0033505 A1 | 2/2012 | Sekine et al. |
| 2012/0057397 A1 | 3/2012 | Ohnuki |
| 2012/0127781 A1 | 5/2012 | Saito |
| 2012/0153276 A1 | 6/2012 | Kamata |
| 2012/0275245 A1 | 11/2012 | Sekine et al. |
| 2013/0308392 A1 | 11/2013 | Nishijima et al. |
| 2014/0085985 A1* | 3/2014 | Pan ............... G11C 5/145 365/185.18 |
| 2014/0177345 A1 | 6/2014 | Yamazaki et al. |
| 2014/0241054 A1 | 8/2014 | Koyama |
| 2014/0269063 A1 | 9/2014 | Nagatsuka et al. |
| 2014/0269099 A1 | 9/2014 | Nagatsuka et al. |
| 2014/0286073 A1 | 9/2014 | Onuki |
| 2014/0374747 A1 | 12/2014 | Kurokawa |
| 2015/0187775 A1 | 7/2015 | Yamamoto et al. |
| 2015/0263006 A1 | 9/2015 | Kato |
| 2015/0263008 A1 | 9/2015 | Atsumi et al. |
| 2015/0263047 A1 | 9/2015 | Kimura et al. |
| 2015/0263725 A1 | 9/2015 | Onuki |
| 2015/0280001 A1 | 10/2015 | Matsuzaki et al. |
| 2015/0310906 A1 | 10/2015 | Matsuzaki et al. |
| 2015/0325285 A1 | 11/2015 | Tsutsui |
| 2015/0348601 A1 | 12/2015 | Onuki |
| 2015/0348608 A1 | 12/2015 | Matsuzaki |
| 2015/0348610 A1 | 12/2015 | Ishizu |
| 2016/0064400 A1 | 3/2016 | Kurokawa |
| 2016/0149567 A1 | 5/2016 | Matsuzaki et al. |
| 2016/0163358 A1 | 6/2016 | Matsuzaki |
| 2016/0172009 A1 | 6/2016 | Matsuzaki et al. |
| 2016/0172010 A1 | 6/2016 | Kato |
| 2016/0172021 A1 | 6/2016 | Ishizu |
| 2016/0172383 A1 | 6/2016 | Nagatsuka |
| 2016/0247548 A1 | 8/2016 | Yamazaki et al. |
| 2017/0125420 A1 | 5/2017 | Matsuzaki |

OTHER PUBLICATIONS

Written Opinion (Application No. PCT/IB2017/056802) dated Jan. 9, 2018.

\* cited by examiner

SEMICONDUCTOR DEVICE, ELECTRONIC COMPONENT, AND ELECTRONIC DEVICE

TECHNICAL FIELD

One embodiment of the present invention relates to a semiconductor device, an electronic component, and an electronic device.

BACKGROUND ART

A recent increase in the amount of data manipulated requires a semiconductor device having high storage capacity.

To manufacture a semiconductor device having high storage capacity, the manufacturing cost per unit storage capacity needs to be reduced. The manufacturing cost can be effectively reduced when the area of a memory cell is reduced by miniaturization or when two or more bit data, i.e., multilevel data is retained in a memory cell so that the area per bit is reduced.

In view of the above, Patent Document 1 discloses a semiconductor device in which multilevel data is retained by utilizing a change in the threshold voltage of a transistor in a memory cell, which depends on the amount of charge accumulated in a floating node of the transistor.

REFERENCE

Patent Document

[Patent Document 1] United States Patent Application Publication No. 2012/0033488

DISCLOSURE OF INVENTION

Variations in transistor characteristics in memory cells cause the amount of charge accumulated in floating nodes of the transistors to vary even when data is written under the same conditions (e.g., voltage and time). That is, different data are written to the memory cells. In particular, a writing voltage needs to fall within a narrow range in the case where multilevel data are retained in the memory cells, which might decrease the reliability of data to be read.

An object of one embodiment of the present invention is to provide a semiconductor device, an electronic component, and an electronic device each of which has a novel structure capable of reducing the effect of variations in the electrical characteristics of transistors. Another object of one embodiment of the present invention is to provide a semiconductor device and the like with a novel structure, from which highly reliable data can be read.

One embodiment of the present invention is a semiconductor device including a data writing circuit, a data reading circuit, and a memory cell. The memory cell includes a first transistor and a second transistor. One of a source and a drain of the first transistor is electrically connected to a gate of the second transistor. The first transistor is configured to hold charge corresponding to first data retained in the memory cell when turned off. The data writing circuit is configured to write the first data and correction data to the memory cell. The data reading circuit is configured to read a first voltage value corresponding to the first data and then read a second voltage value corresponding to the correction data written to the memory cell, convert a voltage value that is equivalent to a difference between the first voltage value and the second voltage value into corrected first data, and output the corrected first data to the data writing circuit.

In one embodiment of the present invention, preferably, the semiconductor device includes a reading bit line, a third transistor, and a fixed potential line; the memory cell and the data reading circuit are electrically connected to the reading bit line; the third transistor is configured to control a conductive state between the reading bit line and the fixed potential line; and the third transistor is on in a period other than periods during which the first voltage value and the second voltage value are read.

In the semiconductor device of one embodiment of the present invention, a channel formation region of the first transistor preferably includes an oxide semiconductor.

In the semiconductor device of one embodiment of the present invention, preferably, the memory cell further includes a fourth transistor; and the fourth transistor is on in a first period during which the first data and the correction data are read.

In the semiconductor device of one embodiment of the present invention, the data writing circuit is preferably configured to write the correction data to the memory cell in the first period.

In the semiconductor device of one embodiment of the present invention, preferably, the data reading circuit includes a capacitor, a potential control circuit, and an analog/digital converter circuit; one electrode of the capacitor is electrically connected to the memory cell; the other electrode of the capacitor is electrically connected to the potential control circuit and the analog/digital converter circuit; and the potential control circuit is configured to set a potential of the other electrode of the capacitor to a fixed potential in the period during which the first voltage value corresponding to the first data is read and bring the potential of the other electrode of the capacitor into an electrically floating state in the period during which the second voltage value corresponding to the correction data is read.

Note that other embodiments of the present invention will be described in the following embodiments with reference to the drawings.

One embodiment of the present invention can provide a semiconductor device, an electronic component, and an electronic device each of which has a novel structure capable of reducing the effect of variations in the electrical characteristics of transistors. Another embodiment of the present invention can provide a semiconductor device and the like with a novel structure, from which highly reliable data can be read.

BEST MODE FOR CARRYING OUT THE INVENTION

Figure 1:
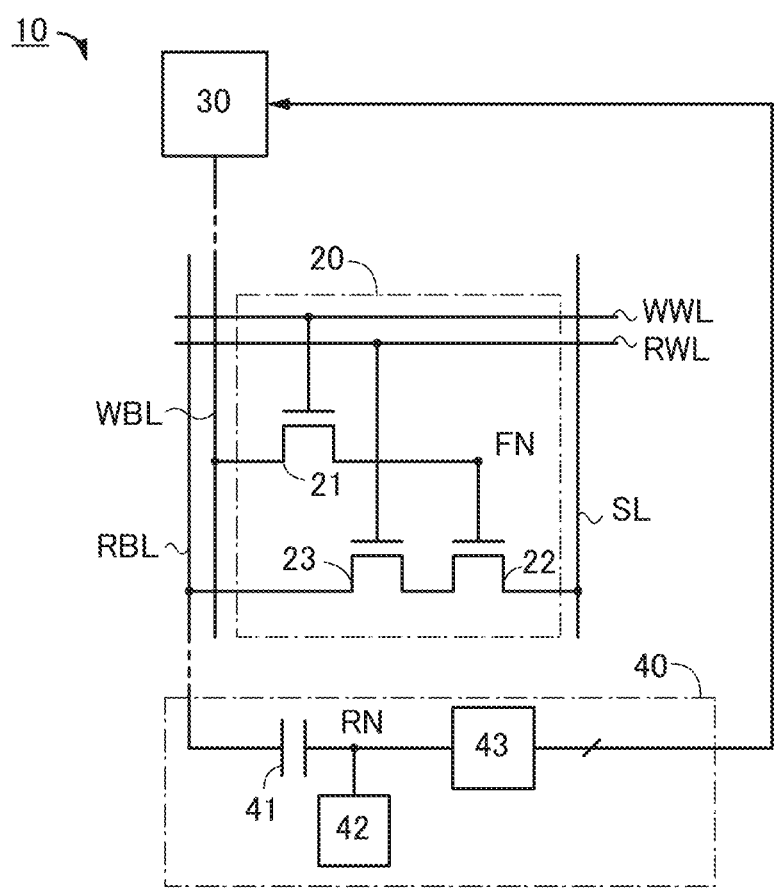
FIG. 1 is a circuit diagram illustrating one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as "first", "second", and "third" are used in order to avoid confusion among components. Thus, the terms do not limit the number or order of components.

The same elements or elements having similar functions, elements formed using the same material, elements formed at the same time, and the like in the drawings are denoted by the same reference numerals, and the description thereof is not repeated in some cases.

Embodiment 1

Described in this embodiment is an example of the structure and operation of a semiconductor device capable of retaining (holding) data.

In this specification and the like, a semiconductor device generally means a device that can function by utilizing semiconductor characteristics. Therefore, a memory cell composed of semiconductor elements such as transistors; peripheral circuits for controlling a memory cell; or the whole system including a memory cell, peripheral circuits, and the like is referred to as a semiconductor device.

<Structure Example of Semiconductor Device>

FIG. 1 is a circuit diagram illustrating a structure example of a semiconductor device 10.

The semiconductor device 10 includes a memory cell 20, a data writing circuit 30, and a data reading circuit 40. The memory cell 20 includes a transistor 21, a transistor 22, and a transistor 23. The data reading circuit 40 includes a capacitor 41, a potential control circuit 42, and an analog/digital converter circuit 43.

The memory cell 20 is connected to a writing word line WWL, a reading word line RWL, a writing bit line WBL, a reading bit line RBL, and a source line SL. Each of the lines is supplied with a signal or a potential for controlling the operation of a memory element. Note that in this specification, each of the lines has a specific name corresponding to the function, but is also simply referred to as a line or a wiring in some cases.

The writing word line WWL is connected to a gate of the transistor 21. The reading word line RWL is connected to a gate of the transistor 23. The writing bit line WBL is connected to one of a source and a drain of the transistor 21. The reading bit line RBL is connected to one of a source and a drain of the transistor 23. The source line SL is connected to one of a source and a drain of the transistor 22.

The other of the source and the drain of the transistor 21 is connected to a gate of the transistor 22. In FIG. 1, the other of the source and the drain of the transistor 21 and the gate of the transistor 22 are connected at a node FN. The transistor 21 serves as a switch. The on/off state (conductive/non-conductive state) of the transistor 21 is controlled by a signal transmitted through the writing word line WWL.

The other of the source and the drain of the transistor 23 is connected to the other of the source and the drain of the transistor 22. The transistor 23 serves as a switch. The on/off state of the transistor 23 is controlled by a signal transmitted through the reading word line RWL.

In FIG. 1, both of the transistors 21 and 23 are n-channel transistors. That is, each transistor is turned on when an H-level signal is applied to the gate and turned off when an L-level signal is applied to the gate. Alternatively, the transistors 21 and 23 may be p-channel transistors, in which case, for example, the logic of a signal of each wiring is inverted.

When the transistor 21 is turned off, charge corresponding to data to be retained can be held in the memory cell 20. The charge corresponding to the data is held at the node FN. The transistor 21 preferably has an extremely low leakage current in the off state. A transistor including an oxide semiconductor in a channel formation region (an OS transistor) is suitable for such a transistor. The OS transistor can operate at high voltages because it has a high maximum voltage that can be applied between a source and a drain or between the source and a gate (has high withstand voltage). This allows the potential of the writing bit line WBL to vary largely with data, so that multilevel data is effectively written.

The transistor 23 is preferably an OS transistor or a transistor including silicon in its channel formation region (a Si transistor). The use of a Si transistor as the transistor 23 can reduce a variation in threshold voltage and increase the amount of current flowing between the source and the drain in an on state. When the transistor 23 is a Si transistor, the transistor 23 and the aforementioned transistor 21 (an OS transistor) can be stacked. The stacked structure reduces the area occupied by a memory cell, achieving a semiconductor device with a high storage capacity.

Since different amounts of charge can be held at the node FN, data are retained in the memory cell 20 as a plurality of voltage values corresponding to multilevel data. The source-gate voltage of the transistor 22 differs with a plurality of voltage values held at the node FN, namely, at the gate, which allows varying the amount of current flowing between the source and the drain when the transistor 23 is turned on. Hence, the reading bit line RBL can have a voltage value corresponding to the amount of charge held at the node FN. Note that the node FN is preferably connected to a capacitor for holding charge, in which case a variation in the voltage value with a change in the amount of charge can be reduced.

Although the transistor 22 is an n-channel transistor in FIG. 1, it may be a p-channel transistor. The transistor 22 is preferably a Si transistor, in which case the transistor 22 can have a small variation in threshold voltage and allow a large amount of current to flow therethrough. In addition, the transistor 22 and the aforementioned transistor 21 (an OS transistor) can be stacked as described above.

Alternatively, all the transistors in the memory cell 20 can be OS transistors and transistors in peripheral circuits such as the data writing circuit 30 and the data reading circuit 40 can be Si transistors. Such a structure enables the memory cell 20 and the peripheral circuits to be stacked, reducing the distance between the peripheral circuits and the wirings. As a result, the parasitic resistance, parasitic capacitance, or the like of each wiring can be reduced.

The data writing circuit 30 has a function of writing multilevel data to the memory cell 20 in a period during which the transistor 21 is on. The data writing circuit 30 also has a function of writing correction data to the memory cell 20 in the period during which the transistor 21 is on.

Note that the multilevel data written to the memory cell 20 by the data writing circuit 30 is analog data corresponding to two or more bit digital data. For example, in the case of multilevel data of two bits, each data corresponds to a voltage value, e.g., $D_{00}=0$ V, $D_{01}=0.5$ V, $D_{10}=1.0$ V, and $D_{11}=1.5$ V where $D_{00}$ denotes data "00", $D_{01}$ denotes data "01", $D_{10}$ denotes data "10", and $D_{11}$ denotes data "11". The voltage values corresponding to multilevel data, such as 0 V, 0.5 V, 1.0 V, and 1.5 V are each referred to as a voltage Va in the following description.

The voltage Va is written to the memory cell 20 with its value increased or decreased from a predetermined voltage value because of a variation caused when analog data is generated in the data writing circuit 30, the parasitic resistance of the writing bit line WBL, a variation in transistor characteristics, or the like. For example, a voltage of 1.0 V is written to the node of the memory cell 20 with its value varied in the range of approximately ±0.1 V. The difference from the predetermined voltage value is referred to as an offset voltage $\Delta V$. That is, a voltage of Va+$\Delta V$ is written to the memory cell 20 to correspond to multilevel data. In the case where multilevel data is retained as one of a plurality of voltage values in the memory cell, the written voltage value needs to fall within a narrow range. Hence, a significant effect of the offset voltage $\Delta V$ reduces the reliability of data because, for example, the same data might be read as different data or different data might be read as the same data.

Note that the correction data written to the memory cell 20 by the data writing circuit 30 is analog data for correcting a voltage value to be read, and for example, has the same voltage value as data "00", i.e., 0 V. When the correction data is written to the memory cell, a voltage of 0 V+$\Delta V$ is written to the node FN. In other words, a voltage value $\Delta V$, which corresponds to the correction data, is written to the memory cell 20.

The data reading circuit 40 reads the voltage value corresponding to the multilevel data that has been written to the memory cell 20. Then, the data reading circuit 40 reads the voltage value corresponding to the correction data that has been written to the memory cell 20. The data reading circuit 40 converts a voltage value, which is equivalent to the difference between the voltage value corresponding to the multilevel data and the voltage value corresponding to the correction data, into corrected multilevel data. The corrected multilevel data is output to the data writing circuit 30 and then rewritten to the memory cell 20.

That is, the data reading circuit 40 reads a voltage value Va+$\Delta V$, which corresponds to multilevel data, from the memory cell 20 through the reading bit line RBL. Then, the data that has been written to the memory cell 20 is rewritten to correction data and a voltage value corresponding to the correction data, $\Delta V$, is read through the reading bit line RBL. Thus, the data reading circuit 40 obtains Va, which is equivalent to the difference between the voltage value corresponding to the multilevel data and the voltage value corresponding to the correction data. In other words, the two pieces of correlated data (Va+$\Delta V$ and $\Delta V$) are read and the offset voltage $\Delta V$, which is a noise component of each data, is eliminated to obtain a highly reliable voltage value Va.

Note that the voltage value that has been written to the node FN in the memory cell 20 is not equal to the voltage value of the reading bit line RBL. However, the voltage value of the node FN correlates with the voltage value of the reading bit line RBL as described above; the two voltage values are the same in this description for easy understanding. In some cases, the voltage value obtained by reading the voltage value Va+$\Delta V$ held at the node FN to the reading bit line RBL is referred to as $V_{Va}+V_{\Delta V}$, and the voltage value obtained by reading the voltage value $\Delta V$ held at the node FN to the reading bit line RBL is referred to as $V_{\Delta V}$.

To obtain the difference between the voltage value corresponding to the multilevel data and the voltage value corresponding to the correction data, one electrode of the capacitor 41 is connected to the reading bit line RBL and the other electrode is connected to a node RN. The node RN is connected to the potential control circuit 42 and the analog/digital converter circuit 43.

The potential control circuit 42 sets the potential of the node RN to a fixed potential in a period during which a voltage value corresponding to the multilevel data is read. The potential control circuit 42 brings the node RN into an electrically floating state in a period during which a voltage value corresponding to the correction data is read. The capacitive coupling of the capacitor 41 produces a voltage value corresponding to the difference between the voltage values corresponding to the multilevel data and the correction data at the node RN. Although the voltage value obtained at the node RN varies with the parasitic capacitance of the node RN, the offset voltage $\Delta V$ can be eliminated in either case.

The voltage value obtained at the node RN, from which the offset voltage $\Delta V$ has been eliminated, is converted into digital data in the analog/digital converter circuit 43 and the like and output to the data writing circuit 30 as well as an external circuit. The data writing circuit 30 writes the data output from the data reading circuit 40 to the memory cell 20 again. This writing operation is performed to write back the multilevel data that has been corrupted when read from the memory cell 20.

As described above, in the structure of one embodiment of the present invention, two pieces of correlated data (Va+$\Delta V$ and $\Delta V$) are read and the offset voltage $\Delta V$, which is a noise component of each data, is eliminated to obtain a highly reliable voltage value Va. In the case where multilevel data is retained as one of a plurality of voltage values in the memory cell, the written voltage value can fall within a narrow range, improving the reliability of data to be read.

<Operation Example of Semiconductor Device>

Then, the operation of the semiconductor device 10 will be described.

First, multilevel data writing operation is described. Here, multilevel data of two bits is described as an example; each of data $D_{00}$, $D_{01}$, $D_{10}$, and $D_{11}$ corresponds to a different voltage value.

Figure 2A:
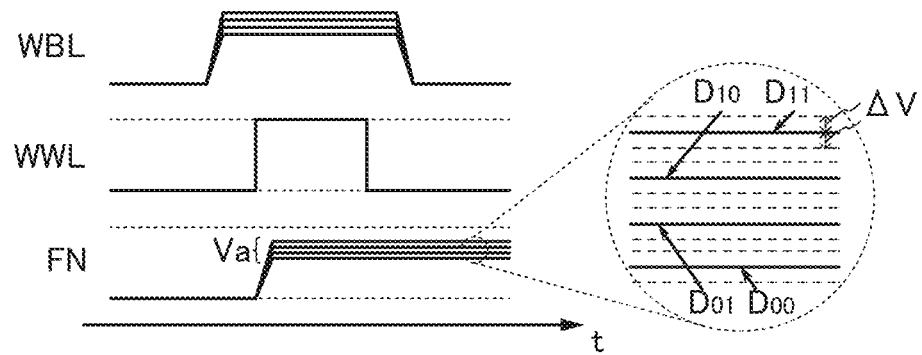
FIGS. 2A and 2B are a timing chart and a circuit diagram illustrating one embodiment of the present invention.

FIG. 2A is a timing chart for describing the state of each wiring in the multilevel data writing operation. First, the writing word line WWL is set to H level while the writing bit line WBL has any one of the voltage values corresponding to the multilevel data, so that the transistor 21 is turned on. Then, the node FN has a voltage value Va corresponding to the multilevel data. As described above, the voltage Va written to the node FN has an offset voltage ΔV. That is, the data $D_{00}$, $D_{01}$, $D_{10}$, and $D_{11}$ each have an offset voltage ΔV.

Figure 2B:
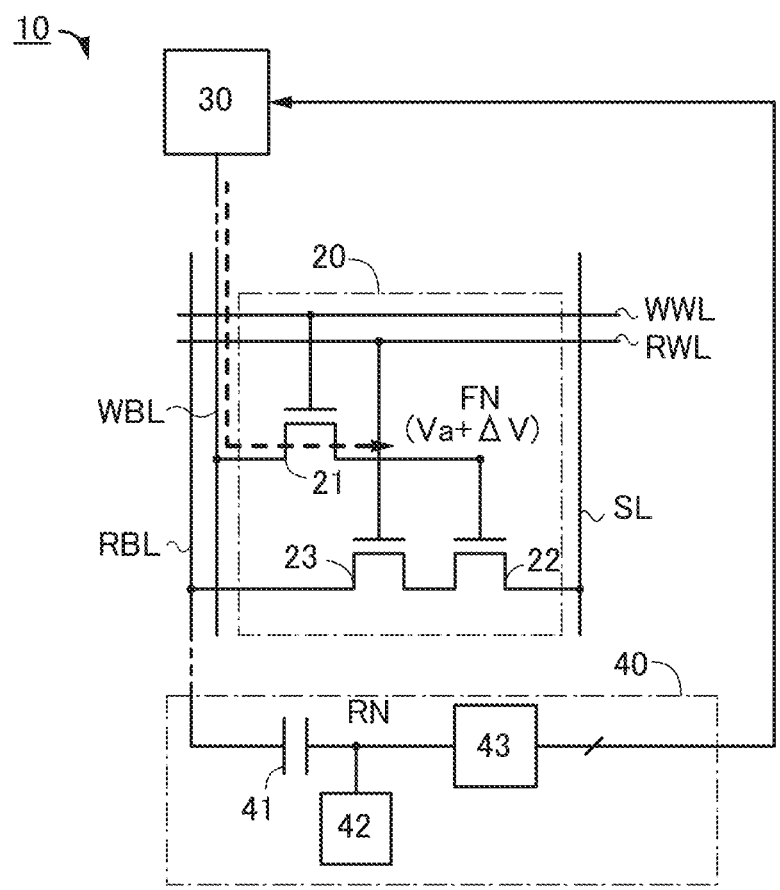

A dashed arrow in FIG. 2B schematically illustrates data flow in the multilevel data writing operation. The voltage value Va+ΔV including the offset voltage is written from the data writing circuit 30 to the node FN in the memory cell 20. In the memory cell 20, the writing word line WWL is set to L level so that charge corresponding to the voltage value of the node FN is held.

Next, multilevel data reading operation is described. The reading operation is divided into two periods: $T_{DATA}$ for reading the voltage value corresponding to the multilevel data held in the memory cell 20; and $T_0$ for reading a voltage value corresponding to correction data, which is newly written to the memory cell 20.

Figure 3:
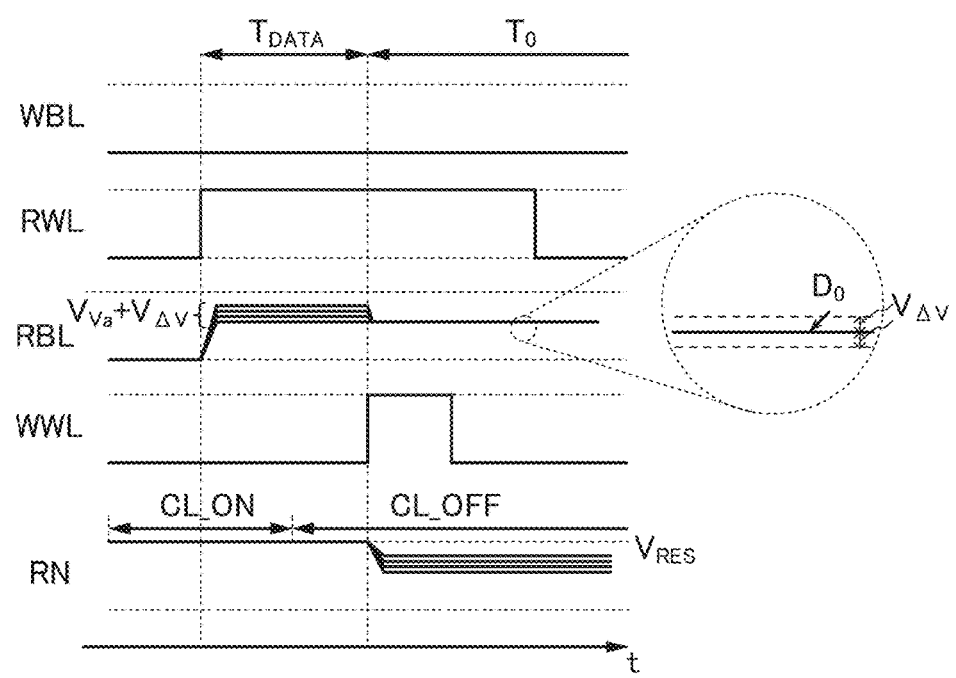
FIG. 3 is a timing chart illustrating one embodiment of the present invention.

FIG. 3 is a timing chart for describing the state of each wiring in the multilevel data reading operation.

In FIG. 3, first, the reading word line RWL is set to H level in the period $T_{DATA}$, so that the transistor 23 is turned on. A current based on the voltage value held at the node FN flows through the transistor 22, and the reading bit line RBL has a voltage value $V_{Va}$ corresponding to the voltage value held at the node FN. In this period, the potential control circuit 42 sets the potential of the node RN to a fixed potential $V_{RES}$ (CL_ON), and then brings the node RN into an electrically floating state (CL_OFF) when the voltage value of the reading bit line RBL is stabilized.

Figure 4A:
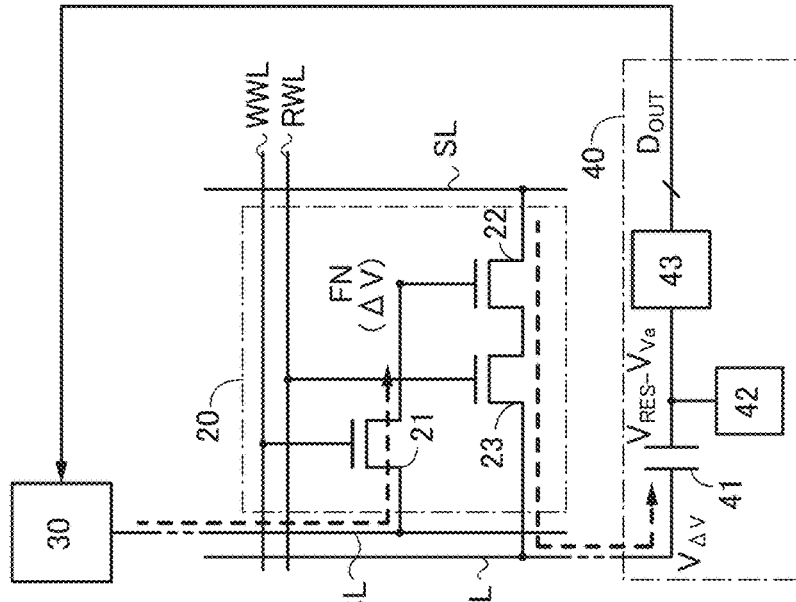
FIGS. 4A and 4B are circuit diagrams illustrating one embodiment of the present invention.

A dashed arrow in FIG. 4A schematically illustrates data flow in the period $T_{DATA}$ in the multilevel data reading operation. One electrode of the capacitor 41 has the voltage value $V_{Va}+V_{\Delta V}$ corresponding to the voltage value Va+ΔV held at the node FN. The voltage value of the other electrode of the capacitor 41 is set to $V_{RES}$ by the control of the potential control circuit 42.

In the period $T_0$ in FIG. 3, the writing word line WWL is set to H level while the writing bit line WBL has the voltage value corresponding to the correction data, so that the transistor 21 is turned on. Then, the node FN has a voltage value ΔV corresponding to the correction data. At this time, the voltage value Va+ΔV corresponding to the multilevel data is eliminated. Accordingly, the value of current flowing through the transistor 22 changes and the voltage value of the one electrode of the capacitor 41 changes to $V_{\Delta V}$. The node RN is in an electrically floating state when the voltage value of the one electrode of the capacitor 41 changes. Hence, capacitive coupling is caused by a change in the voltage value of the one electrode of the capacitor 41, so that the voltage value of the node RN changes. This change corresponds to the difference between $V_{Va}+V_{\Delta V}$ and $V_{\Delta V}$; thus, the voltage value at the node RN is $V_{RES}-V_{Va}$, from which the offset voltage ΔV has been eliminated.

Figure 4B:
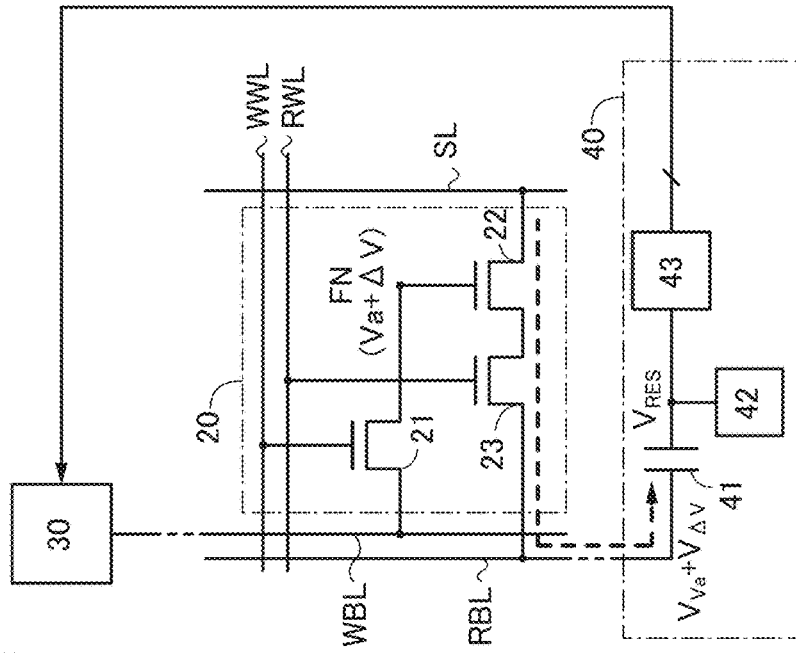

Dashed arrows in FIG. 4B schematically illustrate data flows in the period $T_0$ in the multilevel data reading operation. One electrode of the capacitor 41 has the voltage value $V_{\Delta V}$ corresponding to the voltage value ΔV held at the node FN. The voltage value of the other electrode of the capacitor 41 is set to $V_{RES}-V_{Va}$ by the capacitive coupling of the capacitor 41 because the node RN is brought into an electrically floating state by the control of the potential control circuit 42.

Figure 5:
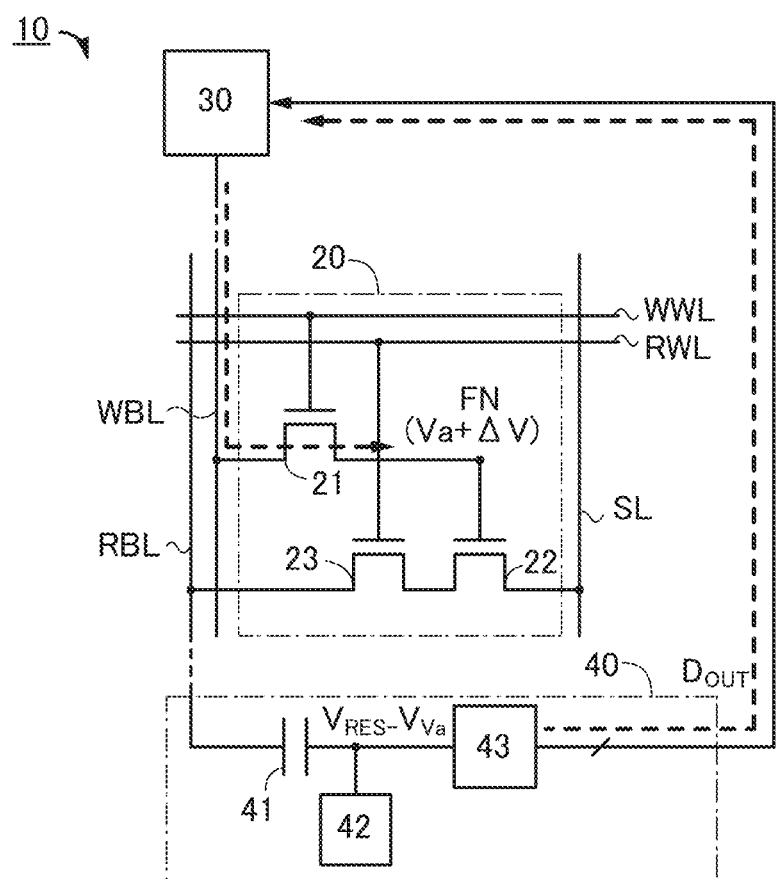
FIG. 5 is a circuit diagram illustrating one embodiment of the present invention.

The voltage value $V_{RES}-V_{Va}$ obtained at the node RN, from which the offset voltage ΔV has been eliminated, is converted into digital data in the analog/digital converter circuit 43 and the like and output to the data writing circuit 30. Dashed arrows in FIG. 5 schematically illustrate data flows in the operation for outputting the read multilevel data to the data writing circuit 30. The data writing circuit 30 writes the data output from the data reading circuit 40 to the memory cell 20 again. This writing operation is performed to write back the multilevel data that has been corrupted when read from the memory cell 20.

As described above, in the structure of one embodiment of the present invention, two pieces of correlated data (Va+ΔV and ΔV) are read and the offset voltage ΔV, which is a noise component of each data, is eliminated to obtain a highly reliable voltage value Va. In the case where multilevel data is retained as one of a plurality of voltage values in the memory cell, the written voltage value can fall within a narrow range, improving the reliability of data to be read. In particular, the memory cell 20 of one embodiment of the present invention has a structure in which the voltage value held at the node FN is read to the data reading circuit 40 through the transistor 22. In this configuration, a variation in the threshold voltage of the transistor 22 largely influences a change in the voltage value Va. The structure of one embodiment of the present invention, in which the offset voltage ΔV is eliminated to remove a variation in noise components including a variation in the threshold voltage of the transistor 22, is extremely effective in obtaining a highly reliable voltage value Va.

<Configuration Examples of Data Writing Circuit and Data Reading Circuit>

Figure 6:
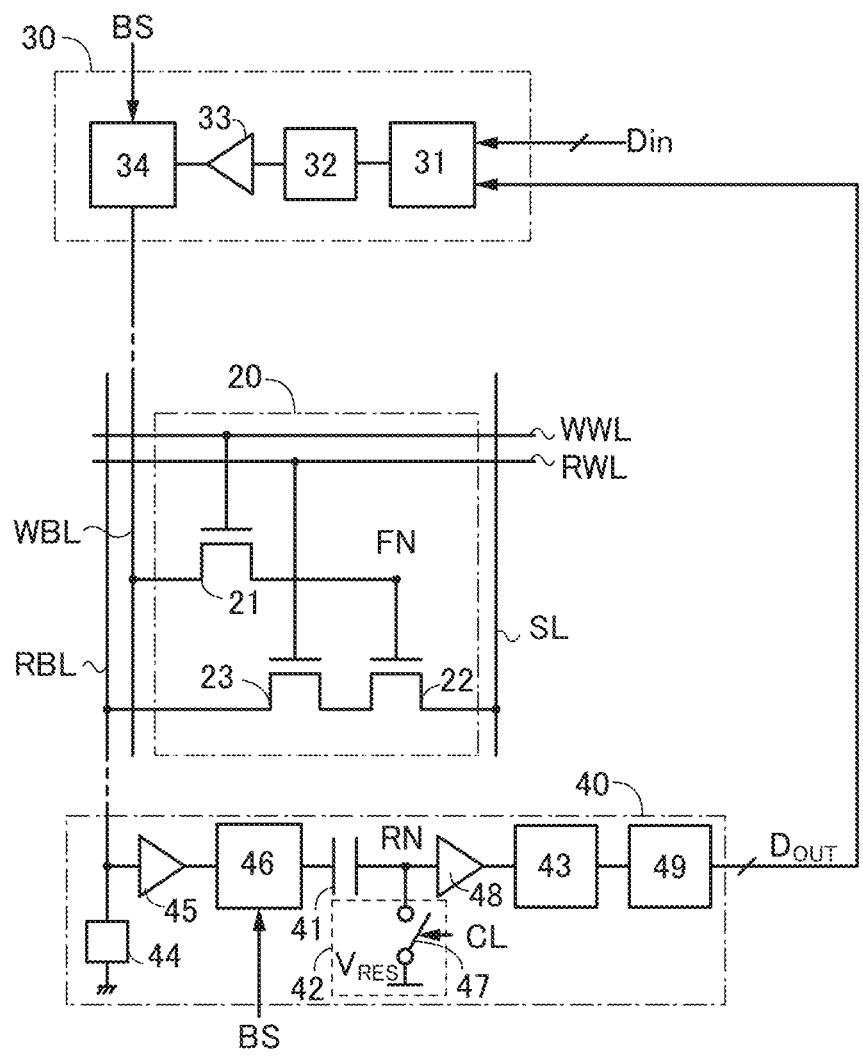
FIG. 6 is a circuit diagram illustrating one embodiment of the present invention.

FIG. 6 is a circuit diagram illustrating specific configuration examples of the data writing circuit 30 and the data reading circuit 40 in the semiconductor device 10 in FIG. 1.

The data writing circuit 30 illustrated in FIG. 6 includes an encoder circuit 31, a digital/analog converter circuit 32, an analog buffer circuit 33, and a block selection circuit 34. The data reading circuit 40 illustrated in FIG. 6 includes a current source circuit 44, an analog buffer circuit 45, a block selection circuit 46, an analog buffer circuit 48, and a decoder circuit 49 in addition to the capacitor 41, the potential control circuit 42, and the analog/digital converter circuit 43. The potential control circuit 42 includes a switch 47 controlled by a control signal CL and a wiring supplied with $V_{RES}$.

The block selection circuit 34 and the block selection circuit 46 receive a block selection signal BS for selecting a plurality of memory cells 20 of each block.

Data Din given to the data writing circuit 30 corresponds to multilevel data or correction data. Data Dout output from the data reading circuit 40 to the data writing circuit 30 corresponds to multilevel data read from the memory cell 20.

The encoder circuit 31 encodes the data Din, which is digital data. The digital/analog converter circuit 32 converts the digital data into analog data. The analog buffer circuit 33 amplifies the analog data with a gain of one and outputs the data.

The current source circuit 44 feeds a constant current so that the voltage value of the reading bit line RBL changes with the voltage value held in the memory cell. The analog buffer circuit 45 amplifies analog data with a gain of one and outputs the data. With the switch 47, the node RN has a fixed potential $V_{RES}$ or is in an electrically floating state. The analog buffer circuit 48 amplifies analog data with a gain of one and outputs the data. The analog/digital converter circuit 43 converts analog data into digital data. The encoder circuit 31 serves as an error correcting code circuit (ECC circuit). The decoder circuit 49 decodes the data that has been encoded by the encoder circuit 31.

The data reading circuit 40 may include an address decoder circuit, a command register circuit, a power source circuit, and the like. The data reading circuit 40 may also include a static RAM (SRAM) as a cache memory. In that configuration, data is temporarily retained in the cache memory in data writing; then, the data in the cache memory may be read by the decoder circuit 49 when an address matches the data in the cache memory. Note that the block selection circuits 34 and 46, which select a predetermined memory cell with the block selection signal BS, can be omitted, in which case the power consumption can be reduced. As the analog buffer circuits 33, 45, and 48, a source follower circuit or a voltage follower circuit of an operation amplifier can be used.

<Configuration Example of Writing Word Line WWL>

In the above memory cell 20, every time data is written to a predetermined memory cell 20, data retained in the memory cells connected to the same writing word line WWL are erased. The block diagram of FIG. 7 illustrates a preferable configuration example to prevent this problem.

Figure 7:
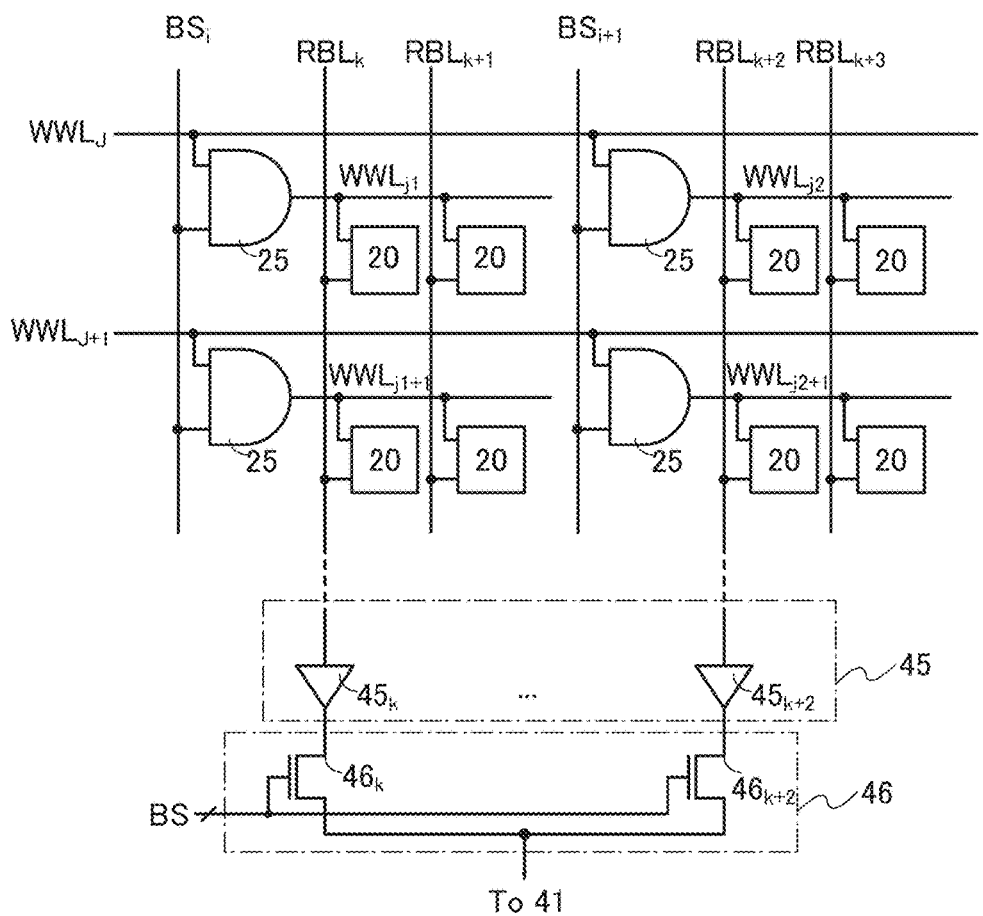
FIG. 7 is a circuit diagram illustrating one embodiment of the present invention.

FIG. 7 illustrates an AND circuit 25 in addition to the memory cell 20, the analog buffer circuit 45, and the block selection circuit 46 illustrated in FIG. 6. In the configuration of FIG. 7, the writing word line WWL is divided, specifically, into a writing word line $WWL_J$, a writing word line $WWL_{J+1}$, a writing word line $WWL_{j1}$, a writing word line $WWL_{j1\pm1}$, a writing word line $WWL_{j2}$, and a writing word line $WWL_{j2+1}$ (J, j1, and j2 are each an arbitrary integer). Other than the writing word lines, a block selection signal BS, a block selection signal $BS_i$, a block selection signal $BS_{i+1}$, a reading bit line $RBL_k$, a reading bit line $RBL_{k+1}$, a reading bit line $RBL_{k+2}$, and a reading bit line $RBL_{k+3}$ (k and i are each an arbitrary integer) are illustrated in the circuit diagram of FIG. 7. An analog buffer circuit $45_k$ and an analog buffer circuit $45_{k+2}$ are illustrated as the analog buffer circuit 45. A transistor $46_k$ and a transistor $46_{k+2}$ are illustrated as the block selection circuit 46.

The writing word line $WWL_J$ of the J-th row controls whether to select the writing word line $WWL_{j1}$ by AND operation with the block selection signal $BS_i$ input to the AND circuit 25. Furthermore, the writing word line $WWL_J$ controls whether to select the writing word line $WWL_{j2}$ by AND operation with the block selection signal $BS_{i+1}$ input to the AND circuit 25. The writing word line $WWL_{J+1}$ of the (J+1)-th row controls whether to select the writing word line $WWL_{j1+1}$ by AND operation with the block selection signal $BS_i$ input to the AND circuit 25. Furthermore, the writing word line $WWL_{J+1}$ controls whether to select the writing word line $WWL_{j2+1}$ by AND operation with the block selection signal $BS_{i+1}$ input to the AND circuit 25.

In the case where the writing word line $WWL_J$ of the J-th row is selected in the configuration of FIG. 7, the writing word line $WWL_{j1}$ or the writing word line $WWL_{j2}$ can be selected to be at H level. Hence, data can be written to the memory cell 20 of the J-th row and the k-th column without loss of data in the memory cell 20 of the J-th row and the (k+2)-th column.

Figure 8:
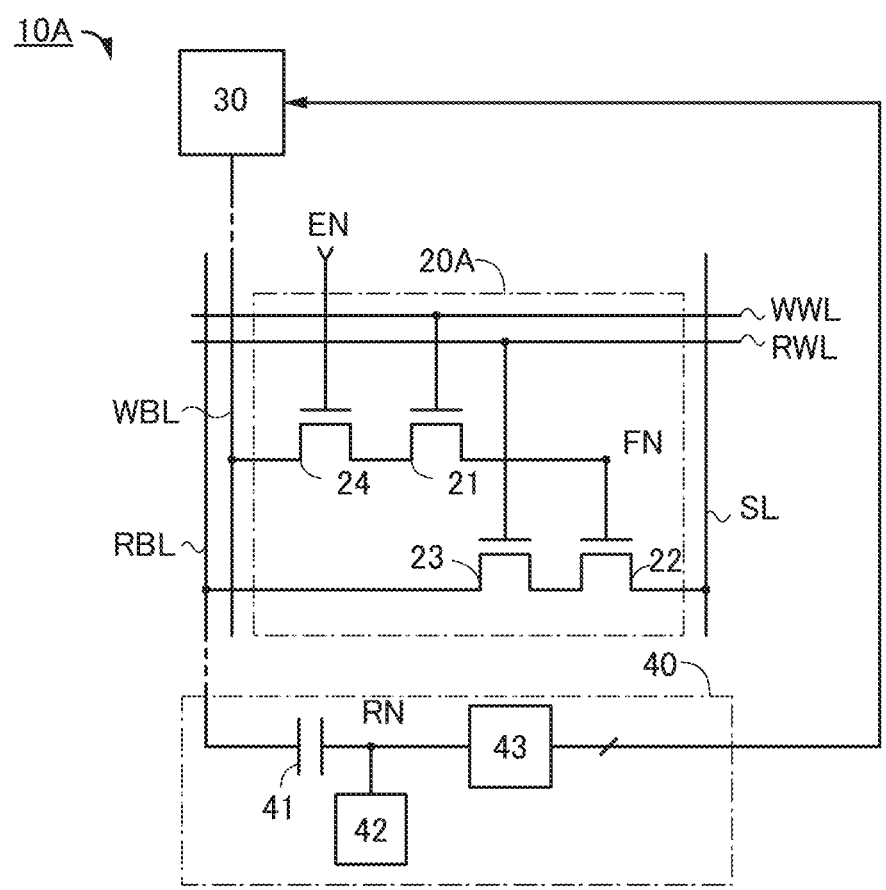
FIG. 8 is a circuit diagram illustrating one embodiment of the present invention.

In the configuration of FIG. 7, different AND circuits are provided for the memory cells of the same row so that the writing word lines WWL can be prevented from being at H level concurrently. As another configuration, for example, a transistor 24 may be provided between the transistor 21 and the writing bit line WBL in a memory cell 20A as illustrated in FIG. 8. In this configuration, with a control signal EN, the transistor 24 in the memory cell to which no data is written can be controlled not to be turned on.

<Modification Example of Semiconductor Device>

Next, a modification example of the structure of the semiconductor device 10 and the operation thereof will be described.

Figure 9A:
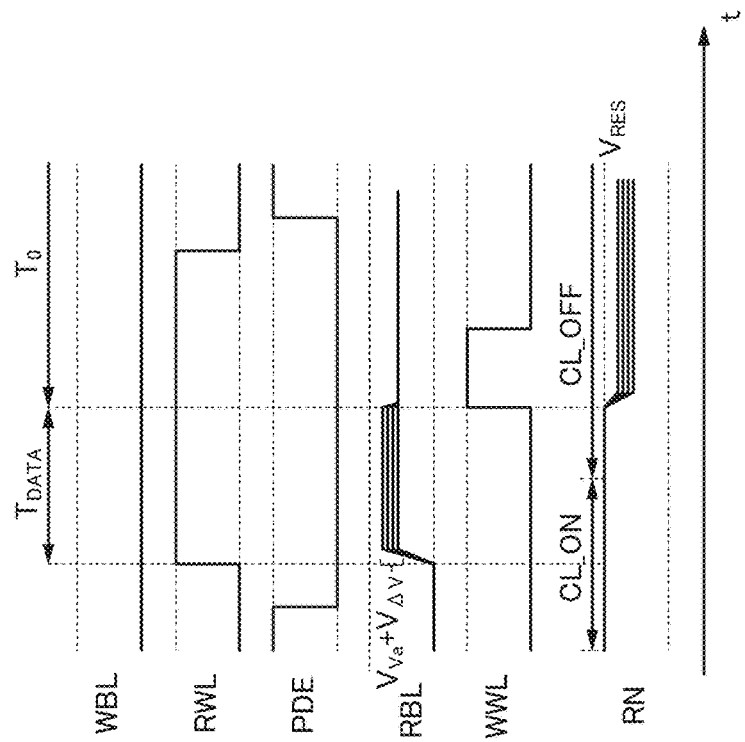
FIGS. 9A and 9B are a circuit diagram and a timing chart illustrating one embodiment of the present invention.

A semiconductor device 10B illustrated in FIG. 9A is different from the semiconductor device 10 illustrated in FIG. 1 in including a transistor 50.

One of a source and a drain of the transistor 50 is connected to the reading bit line RBL. The other of the source and the drain of the transistor 50 is connected to a fixed potential line (a ground line in FIG. 9A). A gate of the transistor 50 is connected to a control line PDE. The control line PDE is supplied with a signal for controlling the conductive state between the reading bit line RBL and the fixed potential line.

The transistor 50 illustrated in FIG. 9A is an n-channel transistor. The transistor 50 serves as a switch that can change the conductive state between the reading bit line RBL and the fixed potential line. Thus, a p-channel transistor may be used as the transistor 50.

Figure 9B:
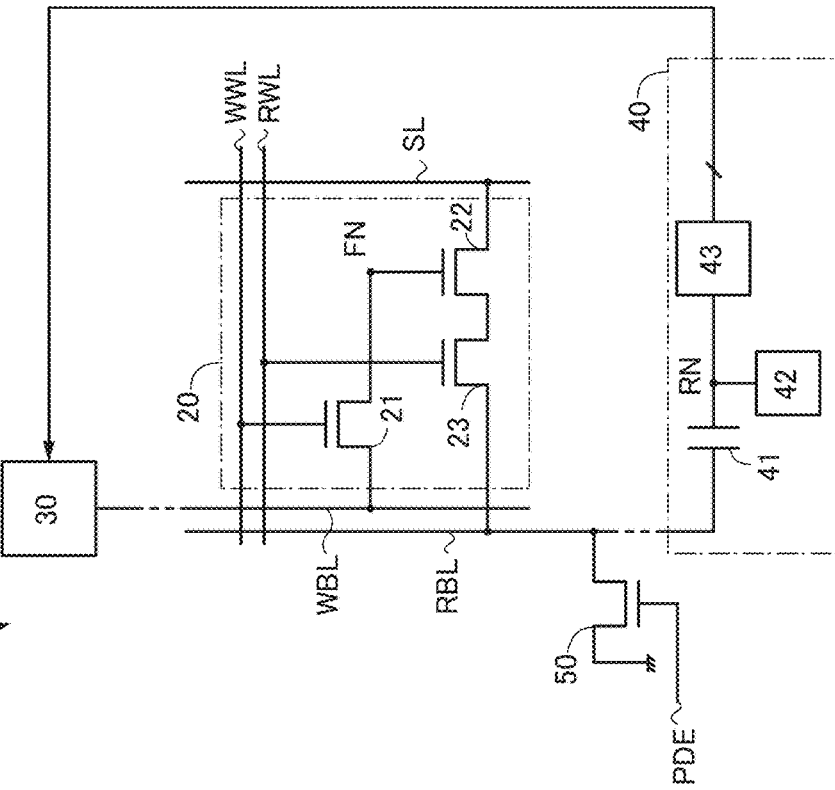

FIG. 9B is a timing chart for describing the operation of the semiconductor device 10B corresponding to the circuit diagram of FIG. 9A. In FIG. 9B, a waveform of a signal supplied to the control line PDE is added to the timing chart of FIG. 3, which shows the operation of the semiconductor device 10.

As illustrated in FIG. 9B, the signal supplied to the control line PDE is at L level in and around a period during which the reading word line RWL is at H level. Also as illustrated in FIG. 9B, the signal supplied to the control line PDE is at H level in a period other than the period during which the reading word line RWL is at H level.

In the configuration illustrated in FIGS. 9A and 9B, data can be read from the memory cell 20 without a variation in reading potential due to unexpected potential change of the reading word line RWL.

The transistor 50 is in a conductive state in a period other than the period during which data is read from the memory cell 20, whereby the potential of the reading bit line RBL can be kept at the potential of the fixed potential line. The transistor 50 is in a non-conductive state in the period during which data is read from the memory cell 20, whereby the potential of the reading bit line RBL can be prevented from being fixed to the potential of the fixed potential line.

In the configuration illustrated in FIGS. 9A and 9B, a variation in reading potential can be reduced; hence, two pieces of correlated data (Va+$\Delta$V and $\Delta$V) can be read and the offset voltage $\Delta$V, which is a noise component of each data, can be eliminated more reliably. As a result, the reliability of data to be read can be improved.

Next, a modification example of the data reading circuit 40 and the operation thereof will be described.

Figure 10A:
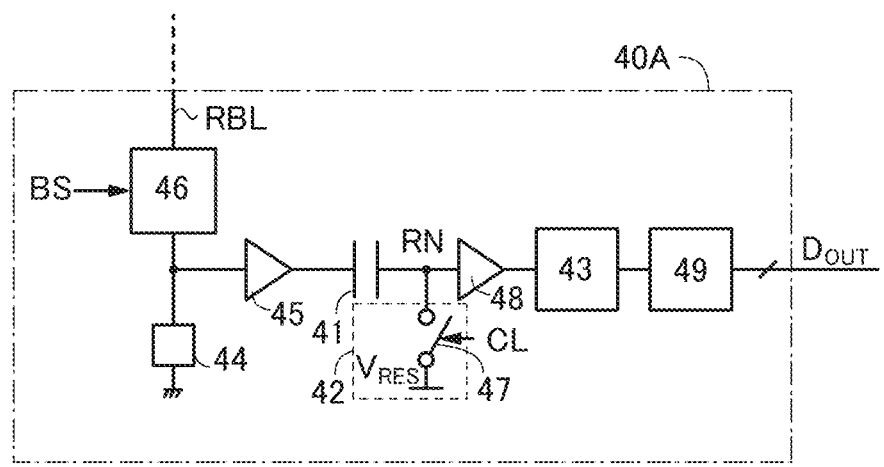
FIGS. 10A and 10B are circuit diagrams illustrating one embodiment of the present invention.

A data reading circuit 40A illustrated in FIG. 10A is different from the data reading circuit 40 illustrated in FIG. 6 in the position of the analog buffer circuit 45 and the block selection circuit 46.

The reading bit line RBL is connected to the block selection circuit 46. The block selection circuit 46 is connected to the current source circuit 44 and the analog buffer circuit 45. The analog buffer circuit 45 is connected to the capacitor 41.

Figure 10B:
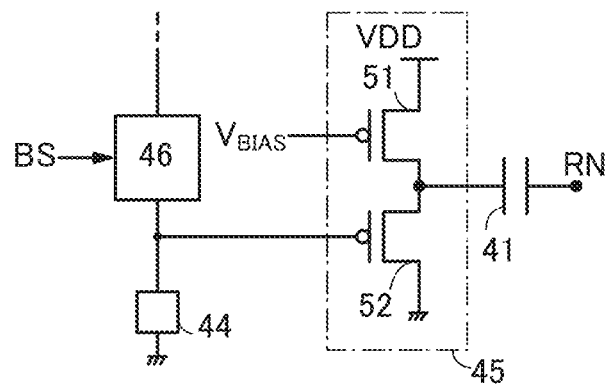

FIG. 10B illustrates a specific circuit configuration of the analog buffer circuit 45. The analog buffer circuit 45 includes a transistor 51 and a transistor 52. The transistors 51 and 52 are p-channel transistors. A bias voltage $V_{BIAS}$ is applied to a gate of the transistor 51.

In the configuration illustrated in FIGS. 10A and 10B, a variation in reading potential can be reduced; hence, two pieces of correlated data (Va+ΔV and ΔV) can be read and the offset voltage ΔV, which is a noise component of each data, can be eliminated more reliably. As a result, the reliability of data to be read can be improved.

<Configuration Example of Memory Cell>

FIGS. 11A to 11D illustrate examples of possible circuit configurations of the memory cell 20 illustrated in FIG. 1.

Figure 11A:
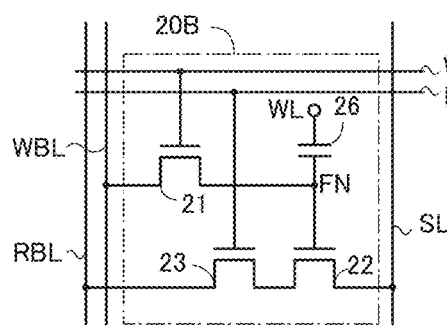
FIGS. 11A to 11D are circuit diagrams illustrating one embodiment of the present invention.

A memory cell 20B illustrated in FIG. 11A includes the transistors 21 to 23 and a capacitor 26. One electrode of the capacitor 26 is connected to the node FN and the other electrode is connected to a wiring WL supplied with a fixed potential. The configuration in FIG. 11A reduces a variation in potential with a change in the charge at the node FN.

Figure 11B:
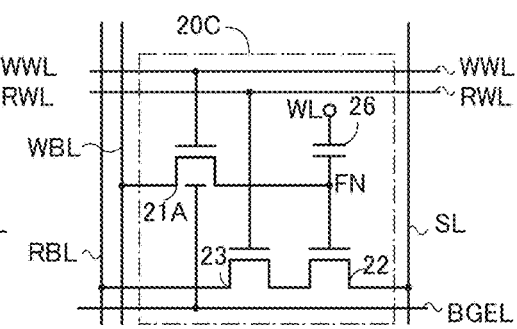

A memory cell 20C illustrated in FIG. 11B includes a transistor 21A, the transistor 22, the transistor 23, and the capacitor 26. The transistor 21A illustrated in FIG. 11B includes a back gate connected to a wiring BGEL. The threshold voltage of the transistor 21A can be controlled by a potential of the wiring BGEL.

Figure 11C:
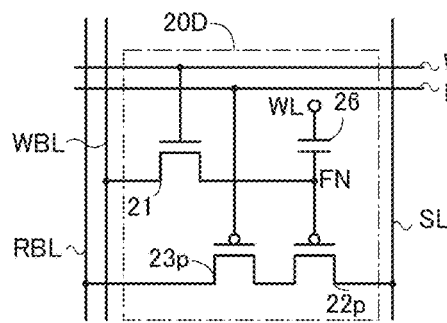

A memory cell 20D illustrated in FIG. 11C includes the transistor 21, a transistor 22p, a transistor 23p, and the capacitor 26. The transistors 22p and 23p are p-channel transistors whereas the transistor 21 is an n-channel transistor. FIG. 11C indicates that the transistors in the memory cell in FIG. 1 can have a variety of polarities.

Figure 11D:
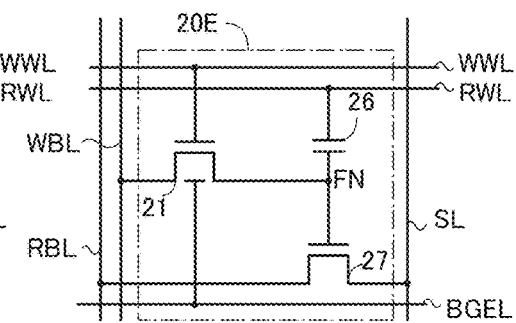

A memory cell 20E illustrated in FIG. 11D includes the transistor 21, a transistor 27, and the capacitor 26. In the memory cell 20E, transistor 23 is not provided and the other electrode of the capacitor 26 is connected to the reading word line RWL. In this configuration, the node FN is brought into an electrically floating state so that the potential of the reading word line RWL changes and the potential of the node FN is controlled with use of capacitive coupling, whereby reading operation is performed. FIG. 11D indicates that the memory cell in FIG. 1 can have a variety of numbers of transistors.

Note that the structures, methods, and the like described in this embodiment can be combined as appropriate with any of the structures, methods, and the like described in the other embodiments.

Embodiment 2

In this embodiment, a cross-sectional structure of a semiconductor device will be described. Described in this embodiment is a cross-sectional structure of the semiconductor device corresponding to the memory cell illustrated in FIG. 11D.

Figure 12:
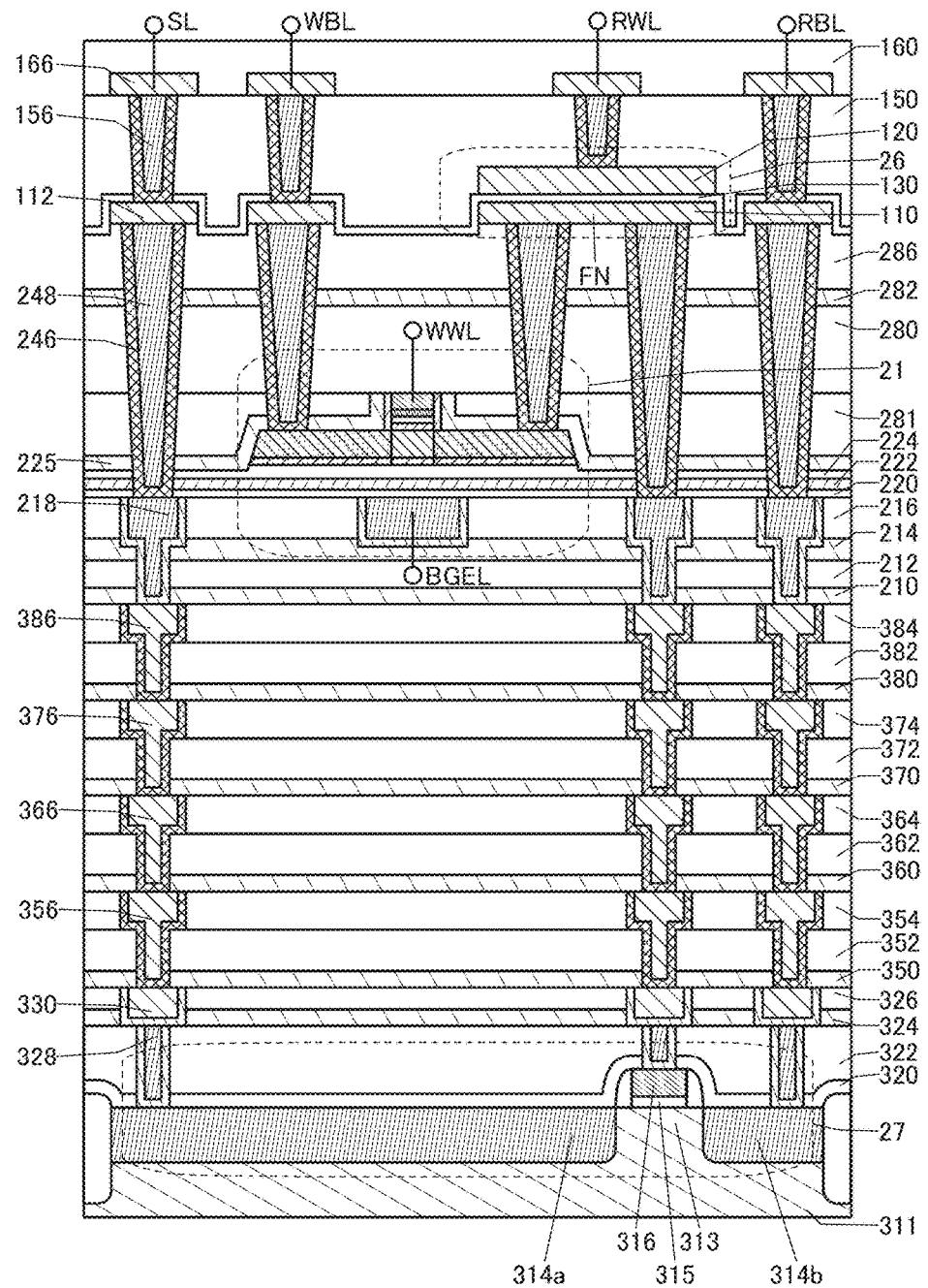
FIG. 12 is a cross-sectional view illustrating one embodiment of the present invention.
Figure 14:
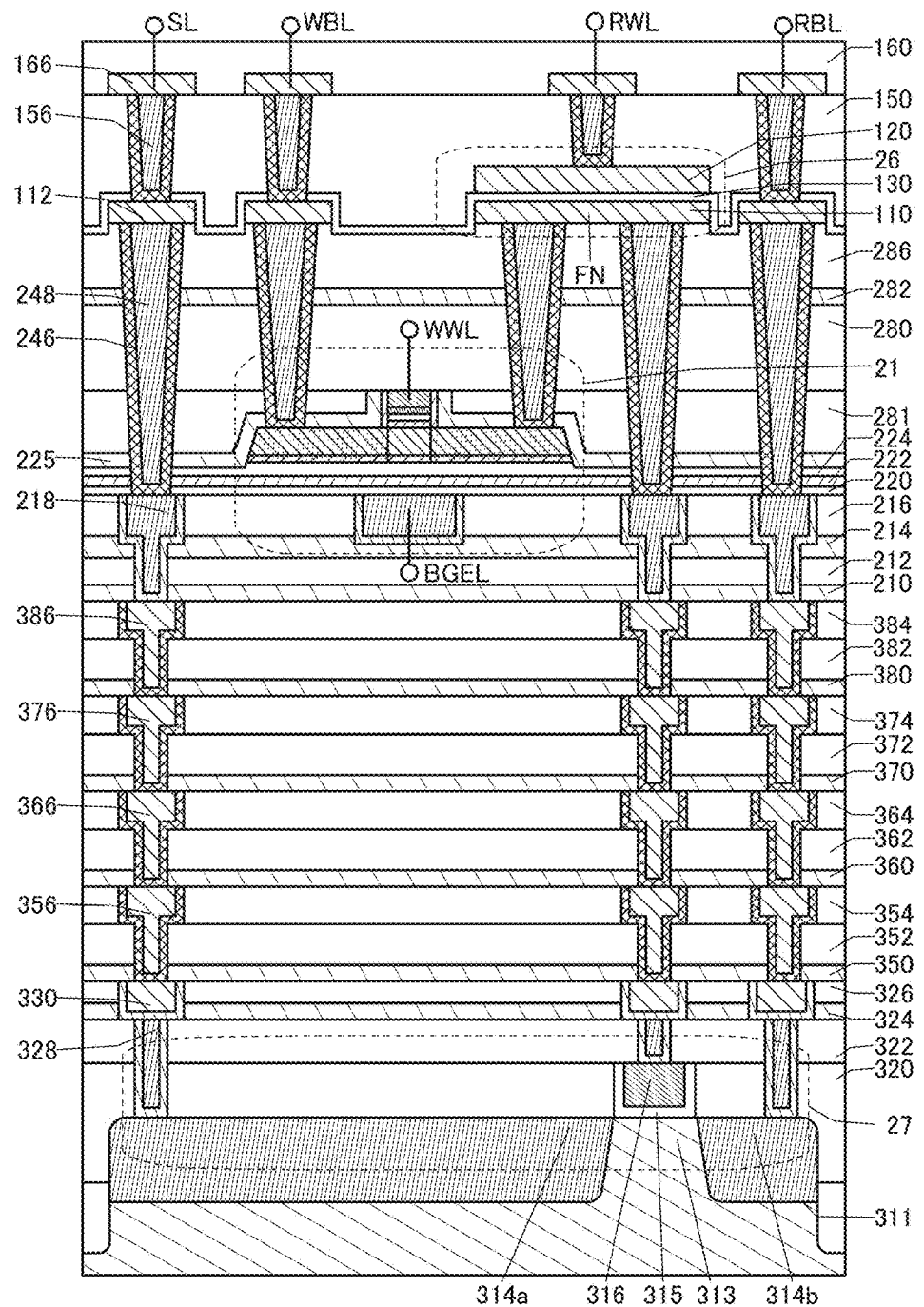
FIG. 14 is a cross-sectional view illustrating one embodiment of the present invention.
Figure 15:
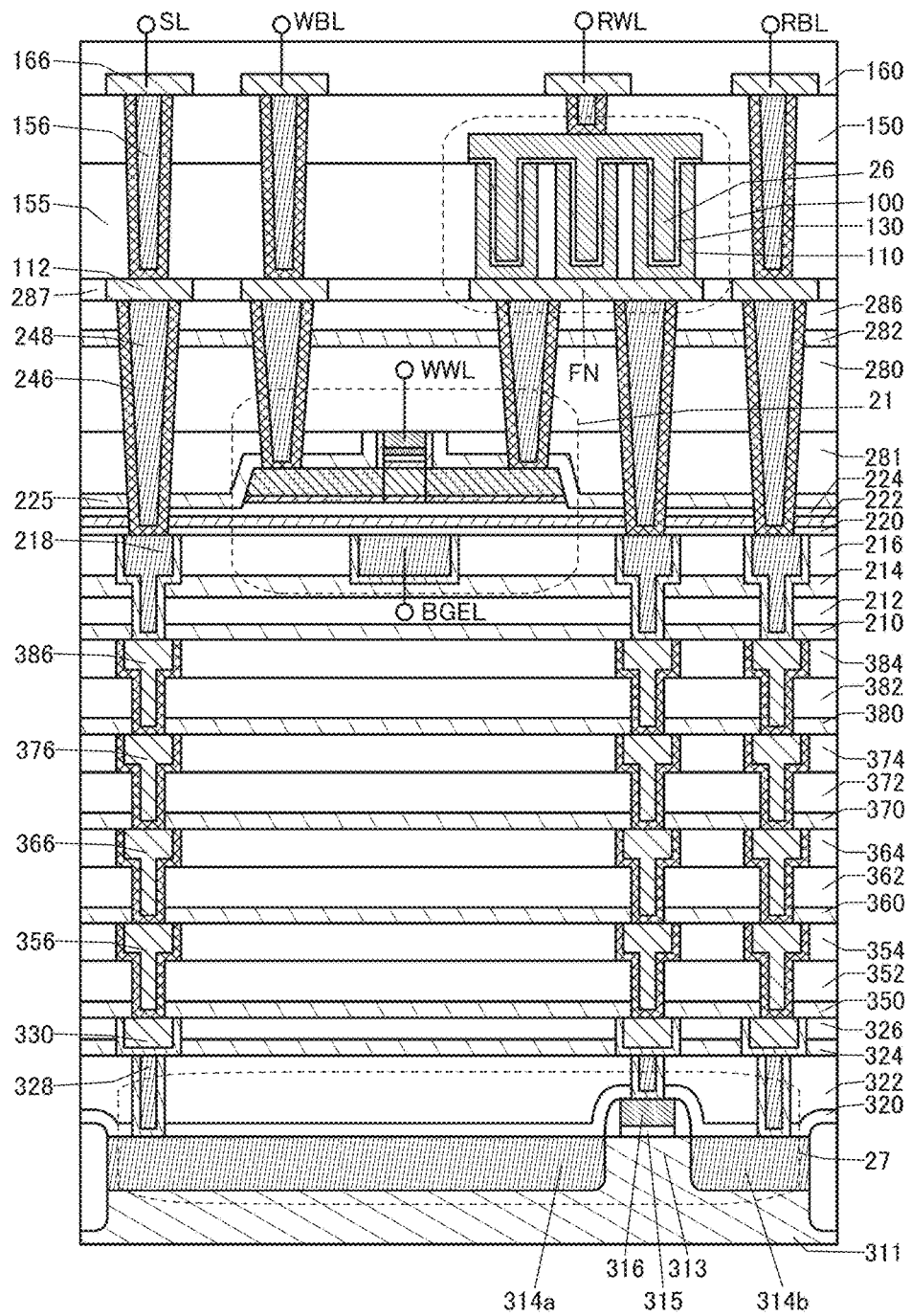
FIG. 15 is a cross-sectional view illustrating one embodiment of the present invention.

The memory cell 20E described in FIG. 11D includes the transistor 27, the transistor 21, and the capacitor 26 as illustrated in FIG. 12, FIG. 14, and FIG. 15.

[Cross-Sectional Structure 1]

The semiconductor device illustrated in FIG. 12 includes the transistor 27, the transistor 21, and the capacitor 26. The transistor 21 is provided above the transistor 27, and the capacitor 26 is provided above the transistors 27 and 21.

The transistor 21 is a transistor in which a channel is formed in a semiconductor layer including an oxide semiconductor (an OS transistor), which is described later. With the OS transistor having the structure illustrated in FIG. 12, the transistor 21 can be formed with a high yield even when miniaturized. The semiconductor device including such an OS transistor can be miniaturized or highly integrated. Since the off-state current of the OS transistor is low, using the OS transistor in the semiconductor device enables stored data to be retained for a long time. In other words, such a semiconductor device does not require refresh operation or has an extremely low frequency of refresh operation, and thus uses sufficiently low power.

As illustrated in FIG. 12, the reading bit line RBL is electrically connected to a drain of the transistor 27, and a wiring SL is electrically connected to a source of the transistor 27. The writing bit line WBL is electrically connected to one of the source and the drain of the transistor 21, the writing word line WWL is electrically connected to a first gate of the transistor 21, and the wiring BGEL is electrically connected to a second gate of the transistor 21. A gate of the transistor 27 and the other of the source and the drain of the transistor 21 are electrically connected to one electrode of the capacitor 26, and the reading word line RWL is electrically connected to the other electrode of the capacitor 26.

The transistor 27 is provided over a substrate 311 and includes a conductor 316, an insulator 315, a semiconductor region 313 that is a part of the substrate 311, and low-resistance regions 314a and 314b serving as a source region and a drain region.

The transistor 27 may be a p-channel transistor or an n-channel transistor.

It is preferable that a region of the semiconductor region 313 where a channel is formed, a region in the vicinity thereof, the low-resistance regions 314a and 314b serving as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 27 may be a high-electron-mobility transistor (HEMT) with GaAs and GaAlAs, or the like.

The low-resistance regions 314a and 314b contain an element that imparts n-type conductivity, such as arsenic or phosphorus, or an element which imparts p-type conductivity, such as boron, in addition to a semiconductor material used for the semiconductor region 313.

The conductor 316 serving as a gate electrode can be formed using a semiconductor material such as silicon containing the element that imparts n-type conductivity, such as arsenic or phosphorus, or the element that imparts p-type conductivity, such as boron, or a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stacked layer of metal materials such as tungsten and aluminum as the conductor. In particular, tungsten is preferable in terms of heat resistance.

Note that the transistor 27 illustrated in FIG. 12 is only an example and is not limited to the structure illustrated therein; an appropriate transistor may be used in accordance with a circuit configuration or a driving method.

An insulator 320, an insulator 322, an insulator 324, and an insulator 326 are stacked sequentially so as to cover the transistor 27.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 27 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents impurities and hydrogen from diffusing from the substrate 311, the transistor 27, or the like into a region where the transistor 21 is formed.

As an example of the film having a barrier property against hydrogen, a silicon nitride film formed by a CVD method can be given. The diffusion of hydrogen to a semiconductor element including an oxide semiconductor, such as the transistor 21, degrades the characteristics of the semiconductor element in some cases. Therefore, a film that prevents hydrogen diffusion is preferably provided between the transistor 21 and the transistor 27. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in the TDS analysis in the range of 50° C. to 500° C., for example.

Note that the permittivity of the insulator 326 is preferably lower than that of the insulator 324. For example, the relative permittivity of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low permittivity is used for an interlayer film, the parasitic capacitance between wirings can be reduced.

A conductor 328, a conductor 330, and the like that are electrically connected to the capacitor 26 or the transistor 21 are embedded in the insulator 320, the insulator 322, the insulator 324, and the insulator 326. Note that the conductor 328 and the conductor 330 each serve as a plug or a wiring. A plurality of structures of conductors serving as plugs or wirings are collectively denoted by the same reference numeral in some cases. Furthermore, in this specification and the like, a wiring and a plug electrically connected to the wiring may be a single component. That is, there are cases where part of a conductor serves as a wiring and part of a conductor serves as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 12, an insulator 350, an insulator 352, and an insulator 354 are stacked sequentially. Furthermore, a conductor 356 is formed in the insulator 350, the insulator 352, and the insulator 354. The conductor 356 serves as a plug or a wiring. Note that the conductor 356 can be formed using a material similar to those used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. In such a structure, the transistor 27 and the transistor 21 can be separated by a barrier layer, so that the diffusion of hydrogen from the transistor 27 to the transistor 21 can be prevented.

Note that as the conductor having a barrier property against hydrogen, tantalum nitride may be used, for example. By stacking tantalum nitride and tungsten, which has high conductivity, the diffusion of hydrogen from the transistor 27 can be prevented while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 12, an insulator 360, an insulator 362, and an insulator 364 are stacked sequentially. Furthermore, a conductor 366 is formed in the insulator 360, the insulator 362, and the insulator 364. The conductor 366 serves as a plug or a wiring. Note that the conductor 366 can be formed using a material similar to those used for forming the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening of the insulator 360 having a barrier property against hydrogen. In such a structure, the transistor 27 and the transistor 21 can be separated by a barrier layer, so that the diffusion of hydrogen from the transistor 27 to the transistor 21 can be prevented.

A wiring layer may be provided over the insulator 364 and the conductor 366. For example, in FIG. 12, an insulator 370, an insulator 372, and an insulator 374 are stacked sequentially. Furthermore, a conductor 376 is formed in the insulator 370, the insulator 372, and the insulator 374. The conductor 376 serves as a plug or a wiring. Note that the conductor 376 can be formed using a material similar to those used for forming the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening of the insulator 370 having a barrier property against hydrogen. In such a structure, the transistor 27 and the transistor 21 can be separated by a barrier layer, so that the diffusion of hydrogen from the transistor 27 to the transistor 21 can be prevented.

A wiring layer may be provided over the insulator 374 and the conductor 376. For example, in FIG. 12, an insulator 380, an insulator 382, and an insulator 384 are stacked sequentially. Furthermore, a conductor 386 is formed in the insulator 380, the insulator 382, and the insulator 384. The conductor 386 serves as a plug or a wiring. Note that the conductor 386 can be formed using a material similar to those used for forming the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening of the insulator 380 having a barrier property against hydrogen. In such a structure, the transistor 27 and the transistor 21 can be separated by a barrier layer, so that the diffusion of hydrogen from the transistor 27 to the transistor 21 can be prevented.

An insulator 210, an insulator 212, an insulator 214, and an insulator 216 are stacked sequentially over the insulator 384. A material having a barrier property against oxygen and hydrogen is preferably used for any of the insulator 210, the insulator 212, the insulator 214, and the insulator 216.

The insulators 210 and 214 are preferably formed using, for example, a film having a barrier property that prevents hydrogen and impurities from diffusing from the substrate 311, a region where the transistor 27 is formed, or the like to a region where the transistor 21 is formed. Therefore, the insulators 210 and 214 can be formed using a material similar to that used for forming the insulator 324.

As an example of the film having a barrier property against hydrogen, a silicon nitride film formed by a CVD method can be given. The diffusion of hydrogen to a semiconductor element including an oxide semiconductor, such as the transistor 21, degrades the characteristics of the semiconductor element in some cases. Therefore, a film that prevents hydrogen diffusion is preferably provided between the transistor 21 and the transistor 27. Specifically, the film that prevents hydrogen diffusion is a film from which hydrogen is less likely to be released.

As the film having a barrier property against hydrogen, for example, as each of the insulators 210 and 214, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in the electrical characteristics of the transistor. Accordingly, the use of aluminum oxide can prevent the entry of impurities such as hydrogen and moisture into the transistor 21 in and after a manufacturing process of the transistor. In addition, release of oxygen from the oxide in the transistor 21 can be prevented. Therefore, aluminum oxide is suitably used as a protective film for the transistor 21.

For example, the insulators 212 and 216 can be formed using a material similar to that used for forming the insulator 320. In the case where an interlayer film is formed of a material with a relatively low permittivity, the parasitic capacitance between wirings can be reduced. For example, a silicon oxide film, a silicon oxynitride film, or the like can be used for the insulators 212 and 216.

A conductor 218, a conductor included in the transistor 21, and the like are embedded in the insulators 210, 212, 214, and 216. Note that the conductor 218 serves as a plug or a wiring that is electrically connected to the capacitor 26 or the transistor 27. The conductor 218 can be formed using a material similar to those used for forming the conductors 328 and 330.

In particular, part of the conductor 218 that is in contact with the insulators 210 and 214 is preferably a conductor with a barrier property against oxygen, hydrogen, and water. In such a structure, the transistors 27 and 21 can be completely separated by the layer with a barrier property against oxygen, hydrogen, and water. As a result, the diffusion of hydrogen from the transistor 27 to the transistor 21 can be prevented.

The transistor 21 is provided over the insulator 214. Note that the transistor 21 in FIG. 12 is only an example and is not limited to the structure illustrated therein; an appropriate transistor may be used in accordance with a circuit configuration or a driving method.

An insulator 280 is provided over the transistor 21. In the insulator 280, an excess-oxygen region is preferably formed. In particular, in the case of using an oxide semiconductor in the transistor 21, when an insulator including an excess-oxygen region is provided in an interlayer film or the like in the vicinity of the transistor 21, oxygen vacancies in the oxide 406 included in the transistor 21 are reduced, whereby the reliability can be improved. The insulator 280 that covers the transistor 21 may serve as a planarization film that covers a roughness thereunder. Note that the insulator 280 is provided in contact with an insulator 281 and an insulator 225 which are formed over the transistor 21.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

An insulator 282 is provided over the insulator 280. A material having a barrier property against oxygen or hydrogen is preferably used for the insulator 282. Thus, the insulator 282 can be formed using a material similar to that used for forming the insulator 214. As the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the transistor 21 in and after a manufacturing process of the transistor. In addition, release of oxygen from the oxide in the transistor 21 can be prevented. Therefore, aluminum oxide is suitably used as a protective film for the transistor 21.

An insulator 286 is provided over the insulator 282. The insulator 286 can be formed using a material similar to that of the insulator 320. In the case where an interlayer film is formed of a material with a relatively low permittivity, the parasitic capacitance between wirings can be reduced. For example, a silicon oxide film, a silicon oxynitride film, or the like can be used for the insulator 286.

A conductors 246, a conductors 248, and the like are embedded in the insulators 220, 222, 224, 280, 282, and 286.

The conductors 246 and 248 serve as plugs or wirings that are electrically connected to the capacitor 26, the transistor 21, or the transistor 27. The conductors 246 and 248 can be formed using a material similar to those used for forming the conductors 328 and 330.

The capacitor 26 is provided above the transistor 21. The capacitor 26 includes a conductor 110, a conductor 120, and an insulator 130.

A conductor 112 may be provided over the conductors 246 and 248. The conductor 112 serves as a plug or a wiring that is electrically connected to the capacitor 26, the transistor 21, or the transistor 27. The conductor 110 serves as an electrode of the capacitor 26. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 12; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 26, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a material with high dielectric strength, such as silicon oxynitride, is preferably used for the insulator 130. In the capacitor 26 having the structure, the dielectric strength can be increased and the electrostatic breakdown of the capacitor 26 can be prevented because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material may be used.

An insulator 150 is provided over the conductor 120 and the insulator 130. The insulator 150 can be formed using a material similar to that used for forming the insulator 320. The insulator 150 may serve as a planarization film that covers a roughness thereunder. A conductor 156 and the like are embedded in the insulator 150. A conductor 166 is provided over the insulator 150 and the conductor 156. An insulator 160 is provided over the insulator 150 and the conductor 166.

The above is the description of the structure example. With the use of the structure, a change in electrical characteristics can be prevented and reliability can be improved in a semiconductor device using a transistor including an oxide semiconductor. The power consumption of a semiconductor device using a transistor including an oxide semiconductor can be reduced. A semiconductor device using a transistor including an oxide semiconductor can be miniaturized or highly integrated. A miniaturized or highly integrated semiconductor device can be provided with a high yield.

<Transistor 21>

An example of the OS transistor that can be used as the aforementioned transistor 21 will be described.

Figure 13A:
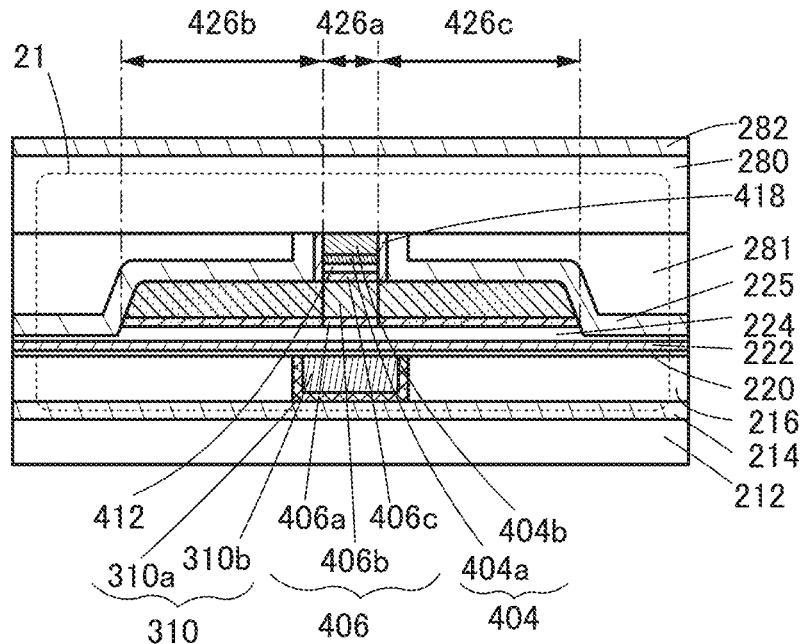
FIGS. 13A and 13B are cross-sectional views illustrating one embodiment of the present invention.

FIG. 13A is a cross-sectional view of the transistor 21, which corresponds to a cross-sectional view in the channel width direction of the transistor 21.

As illustrated in FIG. 13A, the transistor 21 includes the insulator 224 over the insulator 212; an oxide 406*a* over the insulator 224; an oxide 406*b* in contact with at least part of the top surface of the oxide 406*a*; an oxide 406*c* in contact with at least part of the top surface of the oxide 406*b*; an insulator 412 over the oxide 406*c*; a conductor 404*a* over the insulator 412; a conductor 404*b* over the conductor 404*a*; a sidewall insulator 418 in contact with side surfaces of the insulator 412, the conductor 404*a*, and the conductor 404*b*; and an insulator 225 that is in contact with top and side surfaces of the oxide 406*b*, a side surface of the oxide 406*c*, and a side surface of the sidewall insulator 418.

Hereinafter, the oxides 406*a*, 406*b* and 406*c* are collectively referred to as an oxide 406 in some cases. The conductors 404*a* and 404*b* are collectively referred to as a conductor 404 in some cases. The conductors 310*a* and 310*b* are collectively referred to as a conductor 310 in some cases.

The transistor 21 may include the insulator 216 over the insulator 214, and the conductor 310 embedded in the insulator 216.

In the conductor 310, the conductor 310*a* is formed in contact with an inner wall of an opening in the insulator 216, and the conductor 310*b* is formed on the inner side. The top surfaces of the conductors 310*a* and 310*b* can have substantially the same level as the top surface of the insulator 216.

The conductor 404 can serve as a top gate, and the conductor 310 can serve as a back gate. The potential of the back gate may be the same as that of the top gate, or may be the ground potential or a given potential. By changing the potential of the back gate independently of the potential of the top gate, the threshold voltage of the transistor can be changed.

The conductor 310*a* is preferably formed using a conductive material having a function of inhibiting the penetration of impurities such as water and hydrogen (a conductive material that is unlikely to transmit impurities such as water and hydrogen). The conductor 310a is a single layer or a stacked layer, preferably formed using tantalum, tantalum nitride, ruthenium, ruthenium oxide, or the like. Accordingly, diffusion of impurities such as water and hydrogen from a layer under the insulator 214 into an upper layer through the conductor 310 can be inhibited.

The conductor 310b is preferably formed using a conductive material containing tungsten, copper, or aluminum as its main component. Although not illustrated, the conductor 310b may have a stacked-layer structure. For example, titanium, titanium nitride, and the above conductive material may be stacked as the conductor 310b.

The insulator 214 can serve as a barrier insulating film for preventing impurities such as water and hydrogen from entering the transistor from a lower layer. The insulator 214 is preferably formed using an insulating material that has a function of inhibiting the penetration of impurities such as water and hydrogen, and is preferably formed using aluminum oxide or the like, for example. Accordingly, impurities such as water and hydrogen can be prevented from diffusing into layers over the insulator 214.

Furthermore, the insulator 214 is preferably formed using an insulating material that has a function of inhibiting the penetration of oxygen (e.g., an oxygen atom or an oxygen molecule). Thus, oxygen contained in the insulator 224 or the like can be prevented from being diffused to lower layers.

The insulator 222 is preferably formed using an insulating material that has a function of inhibiting the penetration of oxygen and impurities such as water and hydrogen, and is preferably formed using aluminum oxide or hafnium oxide, for example. Accordingly, diffusion of impurities such as water and hydrogen from a layer under the insulator 222 into a layer over the insulator 222 can be inhibited. Furthermore, oxygen contained in the insulator 224 or the like can be prevented from being diffused to lower layers.

Furthermore, the concentration of impurities such as water, hydrogen, and nitrogen oxide in the insulator 224 is preferably lowered. The amount of hydrogen released from the insulator 224 that is converted into hydrogen molecules per unit area of the insulator 224 is less than or equal to $2\times10^{15}$ molecules/cm$^2$, preferably less than or equal to $1\times10^{15}$ molecules/cm$^2$, and further preferably less than or equal to $5\times10^{14}$ molecules/cm$^2$ in thermal desorption spectroscopy (TDS) analysis in the range of 50° C. to 500° C., for example. The insulator 224 is preferably formed using an insulator from which oxygen is released by heating.

The insulator 412 can serve as a first gate insulating film. The insulators 220, 222, and 224 can serve as second gate insulating films.

Figure 13B:
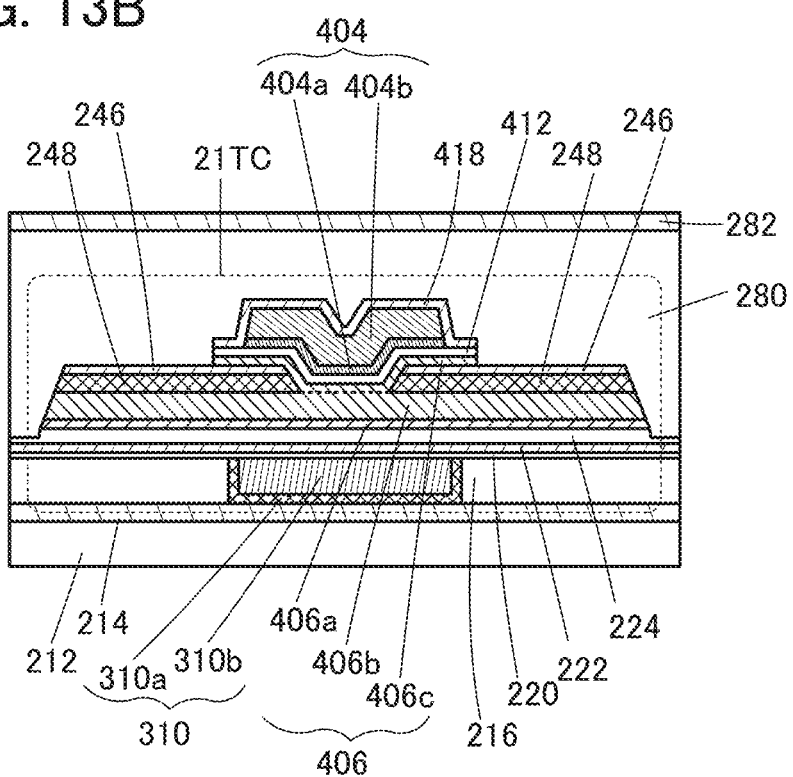

FIG. 13B illustrates a cross-sectional view of a transistor 21TC, which has a structure different from that illustrated in FIG. 13A. FIG. 13B corresponds to, like FIG. 13A, a cross-sectional view in the channel width direction of the transistor 21TC.

The oxide 406 is preferably formed using a metal oxide functioning as an oxide semiconductor (hereinafter, the metal oxide is also referred to as an oxide semiconductor). The metal oxide preferably has an energy gap of 2 eV or more, preferably 2.5 eV or more. With the use of a metal oxide having such a wide energy gap, the off-state current of the transistor can be reduced.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor is In-M-Zn oxide containing indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

In this specification and the like, a metal oxide including nitrogen is also called a metal oxide in some cases. Moreover, a metal oxide including nitrogen may be called a metal oxynitride.

Here, the atomic ratio of the element M to the constituent elements in the metal oxide used as the oxide 406a is preferably greater than that in the metal oxide used as the oxide 406b. Moreover, the atomic ratio of the element M to In in the metal oxide used as the oxide 406a is preferably greater than that in the metal oxide used as the oxide 406b.

When using the above metal oxide as the oxide 406a, it is preferable that the conduction band minimum of the oxide 406a be higher than the conduction band minimum of the region of the oxide 406b where the conduction band minimum is low. In other words, the electron affinity of the oxide 406a is preferably smaller than the electron affinity of the region of the oxide 406b where the conduction band minimum is low.

Here, the energy level of the conduction band minimum is gradually varied in the oxides 406a and 406b. In other words, the energy level of the conduction band minimum is continuously varied or continuously connected. To vary the energy level gradually, the density of defect states in a mixed layer formed at the interface between the oxides 406a and 406b is decreased.

Specifically, when the oxides 406a and 406b contain the same element (as a main component) in addition to oxygen, a mixed layer with a low density of defect states can be formed. For example, in the case where the oxide 406b is an In—Ga—Zn oxide, it is preferable to use an In—Ga—Zn oxide, a Ga—Zn oxide, gallium oxide, or the like as the oxide 406a.

At this time, a narrow-gap portion formed in the oxide 406b serves as a main carrier path. Since the density of defect states at the interface between the oxides 406a and 406b can be decreased, the influence of interface scattering on carrier conduction is small, and a high on-state current can be obtained.

The oxide 406 includes a region 426a, a region 426b, and a region 426c. As illustrated in FIG. 13A, the region 426a is sandwiched between the region 426b and the region 426c. The regions 426b and 426c are reduced in resistance through the formation of the insulator 225, and have higher conductivity than the region 426a. Impurity elements such as hydrogen and nitrogen, which are contained in an atmosphere where the insulator 225 is formed, are added to the regions 426b and 426c. Thus, owing to the added impurity element, oxygen vacancies are generated mainly in the regions of the oxide 406b that overlap with the insulator 225, and furthermore the impurity element enters the oxygen vacancies, which increases the carrier density and decreases the resistance.

Therefore, the concentration of at least one of hydrogen and nitrogen is preferably higher in the regions 426b and 426c than in the region 426a. The concentration of hydrogen or nitrogen can be measured by secondary ion mass spectrometry (SIMS) or the like.

Note that the resistance of the regions 426b and 426c is reduced by the addition of an element that generates oxygen vacancies or an element that is bonded to oxygen vacancies. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon. Thus, the regions 426b and 426c include one or more of the above-described elements.

The regions 426b and 426c are formed in at least the regions of the oxide 406 that overlap with the insulator 225. Here, one of the region 426b and the region 426c in the oxide 406b can function as a source region, and the other can function as a drain region. Moreover, the region 426a in the oxide 406b can function as a channel formation region.

The insulator 412 is preferably provided in contact with the top surface of the oxide 406b. The insulator 412 is preferably formed using an insulator from which oxygen is released by heating. When the insulator 412 formed using such a material is provided in contact with the top surface of the oxide 406b, oxygen can be supplied to the oxide 406b effectively. Furthermore, the concentration of impurities such as water and hydrogen in the insulator 412 is preferably lowered as in the insulator 224. The thickness of the insulator 412 is preferably more than or equal to 1 nm and less than or equal to 20 nm, and may be approximately 10 nm, for example.

The insulator 412 preferably contains oxygen. The amount of oxygen released from the insulator 412, which is converted into oxygen molecules per unit area of the insulator 412, is more than or equal to $1\times10^{14}$ molecules/cm$^2$, preferably more than or equal to $2\times10^{14}$ molecules/cm$^2$, further preferably more than or equal to $4\times10^{14}$ molecules/cm$^2$ in thermal desorption spectroscopy (TDS) in the range of the surface temperatures from 100° C. to 700° C. or from 100° C. to 500° C., for example.

The insulator 412 and the conductor 404 each include a region that overlaps with the oxide 406b. In addition, it is preferable that side surfaces of the insulator 412, the conductor 404a, and the conductor 404b be substantially aligned with each other.

The conductor 404a is preferably formed using a conductive oxide. For example, the metal oxide that can be used as the oxide 406a to the oxide 406c can be used for the conductor 404a. In particular, an In—Ga—Zn-based oxide with an atomic ratio of In:Ga:Zn=4:2:3 to 4.1 or in the neighborhood thereof, which has high conductivity, is preferably used. When the conductor 404a is formed using such a material, oxygen can be prevented from entering the conductor 404b, and an increase in the electric resistance value of the conductor 404c due to oxidation can be prevented.

In addition, by depositing such a conductive oxide by sputtering, oxygen can be added to the insulator 412, which makes it possible to supply oxygen to the oxide 406b. Thus, oxygen vacancies in the region 426a of the oxide 406 can be reduced.

The conductor 404b can be formed using a metal such as tungsten, for example. It is also possible to use, as the conductor 404b, a conductor that can add impurities such as nitrogen to the conductor 404a to improve the conductivity of the conductor 404a. For example, titanium nitride is preferably used for the conductor 404b. Alternatively, the conductor 404b may be a stack including a metal nitride such as titanium nitride and a metal such as tungsten thereover.

Modification Example 1 of Cross-Sectional Structure 1

FIG. 14 illustrates a modification example of this embodiment. FIG. 14 is different from FIG. 12 in the structure of the transistor 27.

In the transistor 27 illustrated in FIG. 14, the semiconductor region 313 (part of the substrate 311) in which the channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 27 having such a structure is also referred to as a FIN transistor because the protruding portion of the semiconductor substrate is utilized. An insulator serving as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

The above is the description of the modification example. With the use of the structure, a change in electrical characteristics can be prevented and reliability can be improved in a semiconductor device using a transistor including an oxide semiconductor. The power consumption of a semiconductor device using a transistor including an oxide semiconductor can be reduced. A semiconductor device using a transistor including an oxide semiconductor can be miniaturized or highly integrated. A miniaturized or highly integrated semiconductor device can be provided with a high yield.

Modification Example 2 of Cross-Sectional Structure 1

FIG. 15 illustrates another modification example of this embodiment. FIG. 15 is different from FIG. 12 in the structure of the capacitor 26.

In a semiconductor device illustrated in FIG. 15, an insulator 287 is provided over the insulator 286, the conductor 112 is embedded in the insulator 287, an insulator 155 is provided over the insulator 287, the conductors 110 are provided in a plurality of openings formed in the insulator 155, the insulator 130 is provided over the conductors 110, and the conductor 120 is provided over the insulator 130 so as to overlap with the conductors 110. The conductor 112 is provided to connect the conductor 248 electrically connected to the transistor 21 and the conductor 248 electrically connected to the transistor 27, and the conductors 110 are provided in contact with the conductor 112. The insulator 287 and the insulator 155 can be formed using a material similar to that of the insulator 320.

In the capacitor 26 illustrated in FIG. 15, the conductors 110, the insulator 130, and the conductor 120 overlap with each other in the openings formed in the insulator 155; thus, the conductors 110, the insulator 130, and the conductor 120 preferably have favorable coverage. For this reason, the conductors 110, the insulator 130, and the conductor 120 are preferably formed by a method with which a film having favorable step coverage can be formed, such as a CVD method or an ALD method.

Because the capacitor 26 is formed along the shapes of the openings formed in the insulator 155, the capacitance can be larger as the openings become deeper. Furthermore, the capacitance can be larger as the number of the openings becomes larger. With the capacitor 26 having such a structure, the capacitance can be increased without increasing the area of the top surface of the capacitor 26.

The above is the description of the modification example. With the use of the structure, a change in electrical characteristics can be prevented and reliability can be improved in a semiconductor device using a transistor including an oxide semiconductor. The power consumption of a semiconductor device using a transistor including an oxide semiconductor can be reduced. A semiconductor device using a transistor including an oxide semiconductor can be miniaturized or highly integrated. A miniaturized or highly integrated semiconductor device can be provided with a high yield.

The structures, methods, and the like described in this embodiment can be combined as appropriate with any of the structures, methods, and the like described in the other embodiments.

Embodiment 3

In this embodiment, one embodiment of a semiconductor device will be described with reference to FIGS. 16A and 16B, FIGS. 17A and 17B, and FIGS. 18A to 18E.
<Semiconductor Wafer and Chip>

Figure 16A:
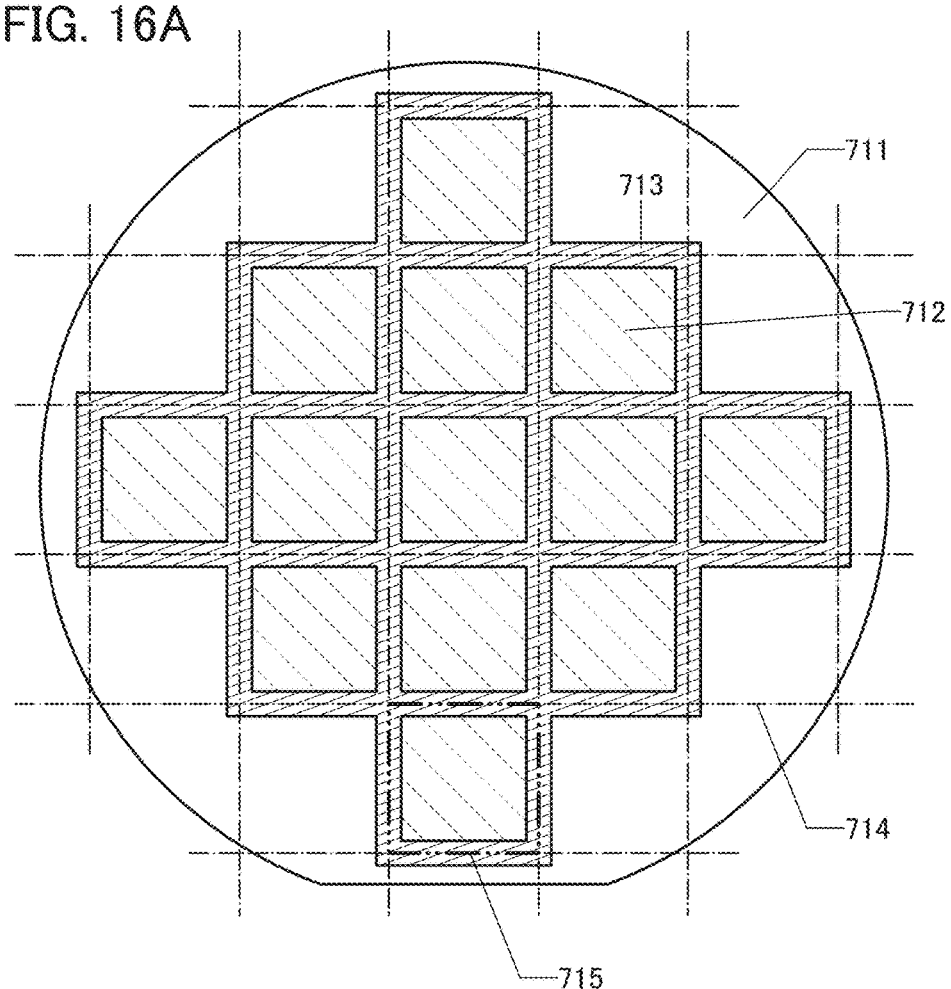
FIGS. 16A and 16B are top views of a semiconductor wafer of one embodiment of the present invention.

FIG. 16A is a top view illustrating the substrate 711 before dicing treatment. As the substrate 711, a semiconductor substrate (also referred to as a "semiconductor wafer") can be used, for example. A plurality of circuit regions 712 are provided over the substrate 711. A semiconductor device or the like of one embodiment of the present invention can be provided in the circuit region 712.

Figure 16B:
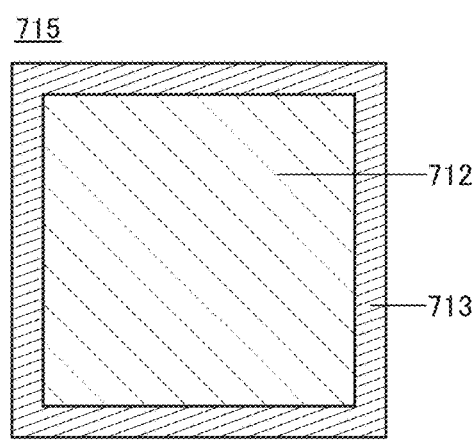

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 16B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer, a semiconductor layer, or the like in the separation regions 713 allows a reduction in the usage of the pure water. Therefore, the cost of manufacturing semiconductor devices can be reduced. Thus, semiconductor devices can be manufactured with improved productivity.
<Electronic Component>

An example of an electronic component using the chip 715 is described with reference to FIGS. 17A and 17B and FIGS. 18A to 18E. Note that the electronic component is also referred to as a semiconductor package or an IC package. The electronic component has a plurality of standards, names, and the like depending on a terminal extraction direction, a terminal shape, and the like.

The electronic component is completed when the semiconductor device described in any of the above embodiments is combined with components other than the semiconductor device in an assembly process (post-process).

Figure 17A:
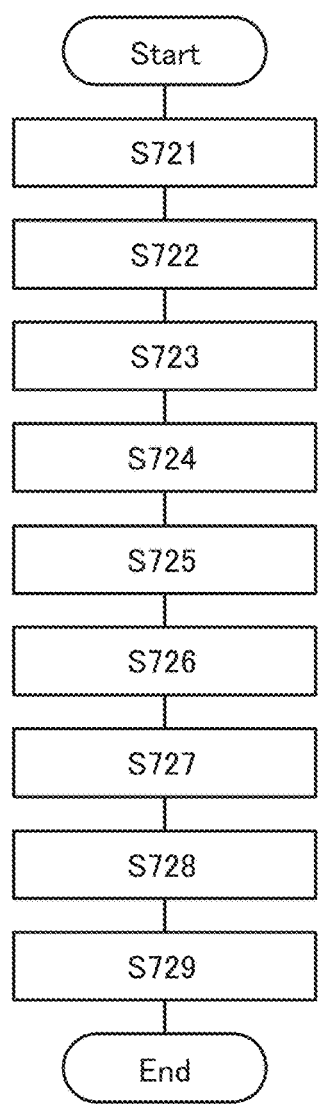
FIG. 17A is a flowchart showing a manufacturing process example of an electronic component.

The post-process is described with reference to a flowchart in FIG. 17A. After the semiconductor device of one embodiment of the present invention and the like are provided over the substrate 711 in a pre-process, a back surface grinding step in which a back surface (a surface where the semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. Ball bonding or wedge bonding can be used as the wire bonding.

The wire-bonded chip 715 is subjected to a molding step of sealing the chip with an epoxy resin or the like (Step S725). Through the molding step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). This plating process prevents rust of the lead and facilitates soldering at the time of mounting the chip on a printed wiring board in a later step. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 17B:
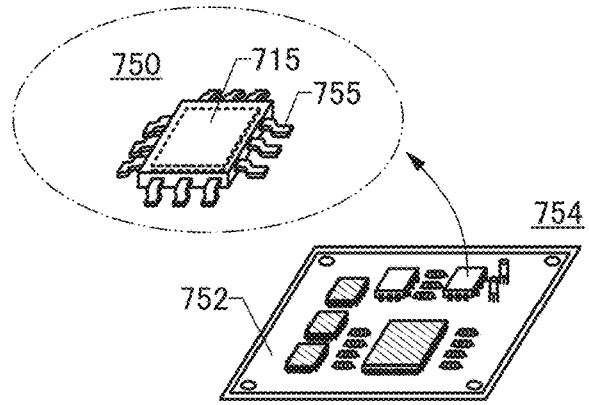
FIG. 17B is a schematic perspective view of the electronic component.

FIG. 17B is a perspective schematic diagram of a completed electronic component. FIG. 17B is a perspective schematic diagram illustrating a quad flat package (QFP) as an example of the electronic component. An electronic component 750 in FIG. 17B includes a lead 755 and the chip 715. The electronic component 750 may include more than one chip 715.

The electronic component 750 in FIG. 17B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

Application examples of the electronic component 750 illustrated in FIG. 17B will be described. The electronic component 750 can be applied to removable storage devices such as memory cards (e.g., SD cards), universal serial bus (USB) memories, and solid state drives (SSD). Some structure examples of removable storage devices will be described with reference to FIGS. 18A to 18E.

Figure 18A:
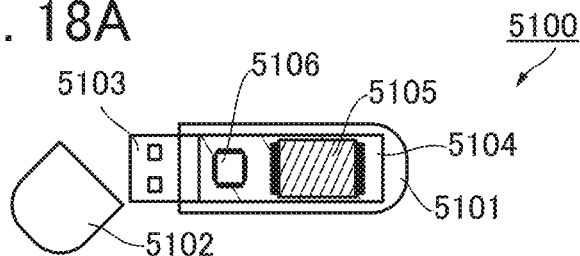
FIGS. 18A to 18E each illustrate an electronic component of one embodiment of the present invention.

FIG. 18A is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory chip, which is an electronic component, and the like. For example, the substrate 5104 is provided with a memory chip 5105 and a controller chip 5106. A memory cell array and the like are incorporated in the memory chip 5105. A processor, a work memory, an ECC circuit, and the like are incorporated in the controller chip 5106. Note that the circuit configurations of the memory chip 5105 and the controller chip 5106 are not limited to those described above, and can be changed depending on circumstances or conditions. The USB connector 5103 functions as an interface for connection to an external device.

Figure 18B:
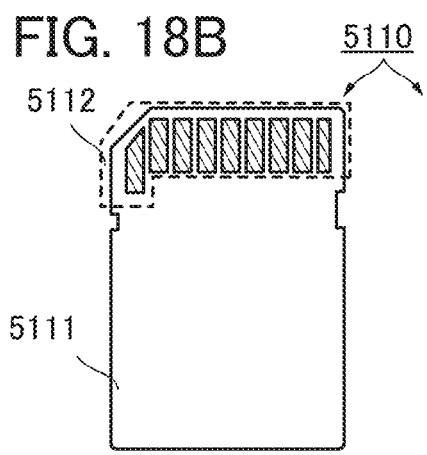
Figure 18C:
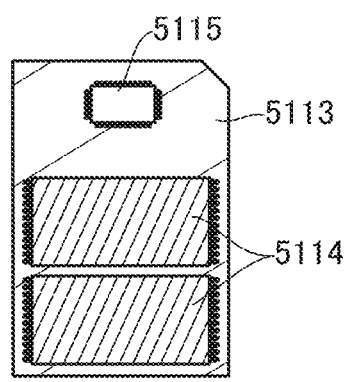

FIG. 18B is a schematic external diagram of an SD card, and FIG. 18C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory chip, which is an electronic component, and the like. For example, the substrate 5113 is provided with a memory chip 5114 and a controller chip 5115. A memory cell array and the like are incorporated in the memory chip 5114. A processor, a work memory, an ECC circuit, and the like are incorporated in the controller chip 5115. Note that the circuit configurations of the memory chip 5114 and the controller chip 5115 are not limited to those described above, and can be changed depending on circumstances or conditions.

When the memory chip 5114 is also provided on a back side of the substrate 5113, the capacity of the SD card 5110 can be increased. In addition, a wireless chip with a radio communication function may be provided on the substrate 5113. This structure enables wireless communication between an external device and the SD card 5110, making it possible to write/read data to/from the memory chip 5114.

Figure 18D:
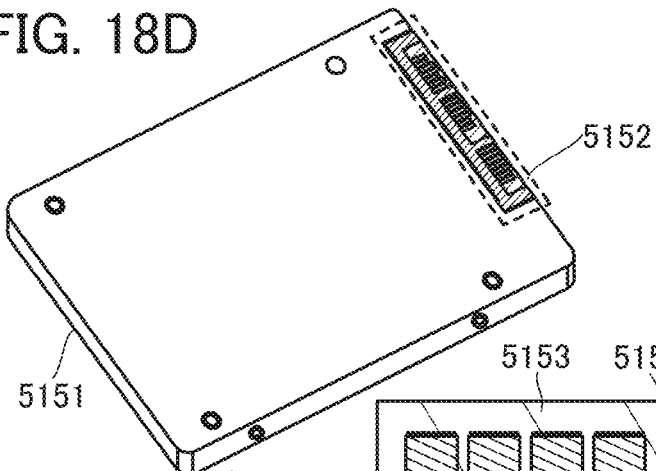
Figure 18E:
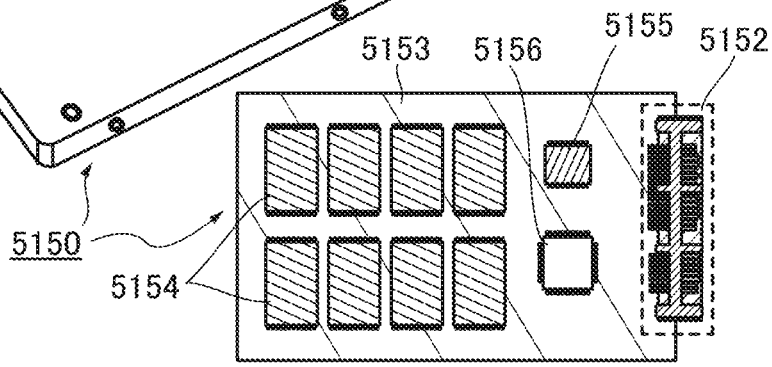

FIG. 18D is a schematic external diagram of an SSD, and FIG. 18E is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory chip, which is an electronic component, and the like. For example, the substrate 5153 is provided with a memory chip 5154, a memory chip 5155, and a controller chip 5156. A memory cell array and the like are incorporated in the memory chip 5154. When the memory chip 5154 is also provided on a back side of the substrate 5153, the capacity of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the memory chips 5154 and 5155 and the controller chip 5156 are not limited to those described above, and can be changed depending on circumstances or conditions. For example, a memory functioning as a work memory may also be provided in the controller chip 5156.

Note that the electronic component 750 illustrated in FIG. 17B is effectively used for a frame memory in a system that processes a large amount of image data, such as a display system that can display an image with "super high definition" (also referred to as "8K resolution", "8K4K", "8K", and the like) using 7680×4320 pixels arranged in a matrix. In the case where multilevel data is retained as one of a plurality of voltage values in a memory cell in the semiconductor device of one embodiment of the present invention, the written voltage value can fall within a narrow range, improving the reliability of data to be read. According to one embodiment of the present invention, the reading accuracy of the frame memory can be improved while the storage capacity is increased; thus, a display system capable of displaying an image with 8K resolution can be effectively achieved.

Note that this embodiment can be combined with any of the other embodiments in this specification as appropriate.

Embodiment 4

<Electronic Device>

An electronic component including the semiconductor device of one embodiment of the present invention can be used in a variety of electronic devices. FIGS. 19A to 19F illustrate specific examples of electronic devices including the electronic component of one embodiment of the present invention.

Figure 19A:
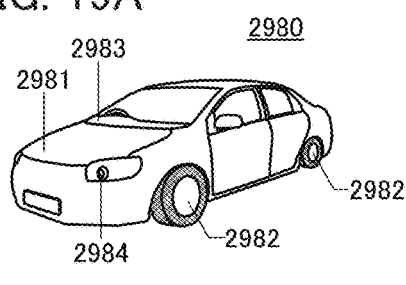
FIGS. 19A to 19F each illustrate an electronic device of one embodiment of the present invention.

FIG. 19A is an external view illustrating an example of a car. A car 2980 includes a car body 2981, wheels 2982, a dashboard 2983, lights 2984, and the like. The car 2980 also includes an antenna, a battery, and the like.

Figure 19B:
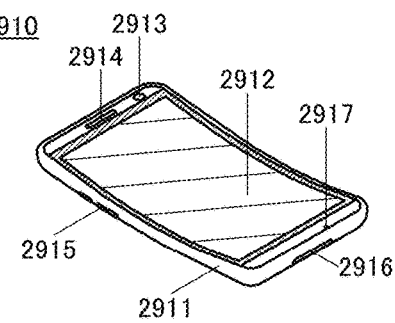

An information terminal 2910 illustrated in FIG. 19B includes a housing 2911 provided with a display portion 2912, a microphone 2917, a speaker portion 2914, a camera 2913, an external connection portion 2916, an operation switch 2915, and the like. A display panel and a touch screen that use a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 19C:
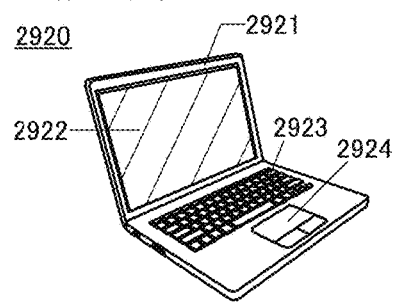

A notebook personal computer 2920 illustrated in FIG. 19C includes a housing 2921, a display portion 2922, a keyboard 2923, a pointing device 2924, and the like. In addition, the notebook personal computer 2920 includes an antenna, a battery, and the like inside the housing 2921.

Figure 19D:
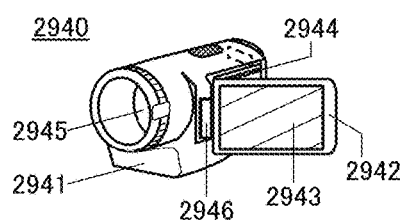

A video camera 2940 in FIG. 19D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In addition, the video camera 2940 includes an antenna, a battery, and the like inside the housing 2941. The housing 2941 and the housing 2942 are connected to each other with the joint 2946, and the angle between the housing 2941 and the housing 2942 can be changed with the joint 2946. The orientation of an image on the display portion 2943 can be changed and display and non-display of an image can be switched depending on the angle between the housings 2941 and 2942.

Figure 19E:
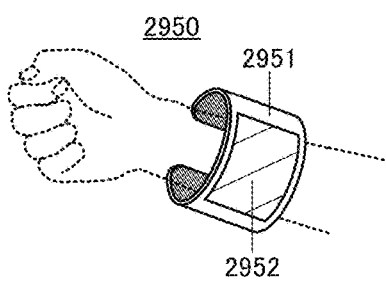

FIG. 19E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 19F:
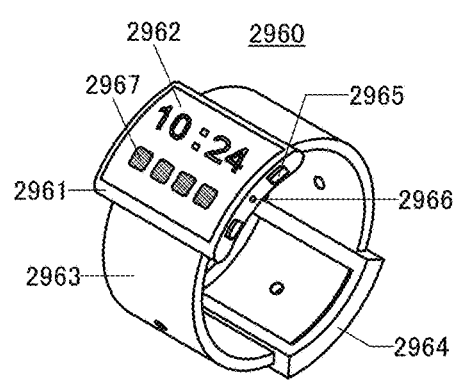

FIG. 19F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. In addition, charging via the input/output terminal 2966 is possible. Note that the charging operation may be performed by wireless power feeding without using the input/output terminal 2966.

The electronic component including the semiconductor device of one embodiment of the present invention can hold, for example, control data or a control program of the above electronic device for a long time. With the use of the semiconductor device of one embodiment of the present invention, a highly reliable electronic device can be provided.

This embodiment can be implemented in appropriate combination with any of the structures described in the other embodiments and the like.

(Supplementary Notes on the Description in this Specification and the Like)

The following are notes on the description of the above embodiments and the structures in the embodiments.

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content (or part thereof) in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on situations.

In the drawings, the size, the layer thickness, or the region has arbitrary magnitude for description convenience. Therefore, the scale is not necessarily limited to that illustrated in the drawings. Note that the drawings are schematically illustrated for clarity, and shapes or values are not limited to those illustrated in the drawings. For example, the following can be included: variation in signal, voltage, or current due to noise or difference in timing.

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit the function of the component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, "voltage" and "potential" can be replaced with each other. The voltage refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path.

Examples of a switch include an electrical switch and a mechanical switch. That is, any element can be used as a switch as long as it can control current, without limitation to a certain element.

Examples of an electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

When a transistor is used as a switch, a "conductive state" of the transistor refers to a state in which a source and a drain of the transistor are electrically short-circuited. Furthermore, a "non-conductive state" of the transistor refers to a state in which the source and the drain of the transistor are electrically disconnected. Note that if the transistor operates just as a switch, there is no particular limitation on the polarity (conductivity type) of the transistor.

An example of a mechanical switch is a switch formed using a MEMS (microelectromechanical system) technology, such as a digital micromirror device (DMD). Such a switch includes an electrode that can be moved mechanically, and operates by controlling conduction and non-conduction in accordance with movement of the electrode.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate overlap with each other or a region where a channel is formed.

In this specification and the like, the expression "A and B are connected" means the case where A and B are electrically connected to each other as well as the case where A and B are directly connected to each other. Here, the expression "A and B are electrically connected" means the case where electric signals can be transmitted and received between A and B when an object having any electric action exists between A and B.

Example

A 6-bit/cell semiconductor device was fabricated to demonstrate writing and reading of multilevel data. In this example, each sample was fabricated with 0.15 µm CMOS and 0.35 µm OS FET technology.

Figure 20:
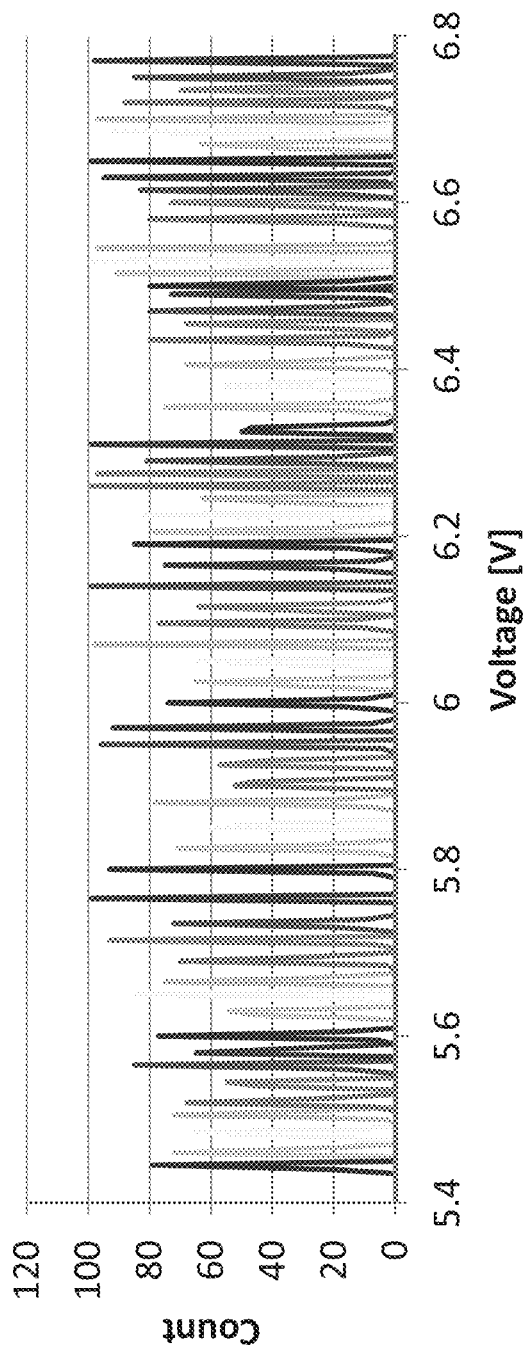
FIG. 20 shows the distribution in a 6-bit/cell memory cell.

FIG. 20 shows the distribution of voltages read from the prototype memory cells. FIG. 20 proves that 64 levels are distributed separately from each other.

As described above, in this example, a 6-bit/cell semiconductor device using OS transistors was fabricated. Writing and reading of 6-bit data were demonstrated by the fabricated semiconductor device. It was also shown that the distribution of read voltages of each data had ±3σ of 25 mV or less in a simple writing operation with no verify operation. This means that the read voltages can be distributed stably even with an increase in the capacity of the memory cell.

REFERENCE NUMERALS

10: semiconductor device 20: memory cell 20A: memory cell 20B: memory cell 20C: memory cell 20D: memory cell 20E: memory cell 21: transistor 21A: transistor 21TC: transistor 22: transistor 22p: transistor 23: transistor 23p: transistor 24: transistor 25: AND circuit 26: capacitor 27: transistor 30: circuit 31: encoder circuit 32: digital/analog converter circuit 33: analog buffer circuit 34: block selection circuit 40: circuit 41: capacitor 42: potential control circuit 43: analog/digital converter circuit 44: current source circuit 45: analog buffer circuit 46: block selection circuit 47: switch 48: analog buffer circuit 49: decoder circuit 50: transistor 51: transistor 52: transistor 110: conductor 112: conductor 120: conductor 130: insulator 150: insulator 155: insulator 205: conductor 210: insulator 212: insulator 214: insulator 216: insulator 218: conductor 220: insulator 222: insulator 224: insulator 225: insulator 246: conductor 248: conductor 280: insulator 281: insulator 282: insulator 286: insulator 287: insulator 310: conductor 310a: conductor 310b: conductor 311: substrate 313: semiconductor region 314a: low-resistance region 314b: low-resistance region 315: insulator 316: conductor 320: insulator 322: insulator 324: insulator 326: insulator 328: conductor 330: conductor 350: insulator 352: insulator 354: insulator 356: conductor 360: insulator 362: insulator 364: insulator 366: conductor 370: insulator 372: insulator 374: insulator 376: conductor 380: insulator 382: insulator 384: insulator 386: conductor 404: conductor 404a: conductor 404b: conductor 404c: conductor 406: oxide 406a: oxide 406b: oxide 406c: oxide 412: insulator 418: sidewall insulator 426a: region 426b: region 426c: region 711: substrate 712: circuit region 713: separation region 714: separation line 715: chip 750: electronic component 752: printed circuit board 754: circuit board 755: lead 2910: information terminal 2911: housing 2912: display portion 2913: camera 2914: speaker portion 2915: operation switch 2916: external connection portion 2917: microphone 2920: notebook personal computer 2921: housing 2922: display portion 2923: keyboard 2924: pointing device 2940: video camera 2941: housing 2942: housing 2943: display portion 2944: operation switch 2945: lens 2946: joint 2950: information terminal 2951: housing 2952: display portion 2960: information terminal 2961: housing 2962: display portion 2963: band 2964: buckle 2965: operation switch 2966: input/output terminal 2967: icon 2980: car 2981: car body 2982: wheel 2983: dashboard 2984: light 5100: USB memory 5101: housing 5102: cap 5103: USB connector 5104: substrate 5105: memory chip 5106: controller chip 5110: SD card 5111: housing 5112: connector 5113: substrate 5114: memory chip 5115: controller chip 5150: SSD 5151: housing 5152: connector 5153: substrate 5154: memory chip 5155: memory chip 5156: controller chip This application is based on Japanese Patent Application Serial No. 2016-219834 filed with Japan Patent Office on Nov. 10, 2016, Japanese Patent Application Serial No. 2017-032226 filed with Japan Patent Office on Feb. 23, 2017, and Japanese Patent Application Serial No. 2017-118566 filed with Japan Patent Office on Jun. 16, 2017, the entire contents of which are hereby incorporated by reference.

The invention claimed is:
1. A semiconductor device comprising:
a data writing circuit;
a data reading circuit; and
a memory cell comprising first and second transistors,
wherein:
a source or a drain of the first transistor is electrically connected to a gate of the second transistor, the first transistor is configured to hold charge corresponding to data retained in the memory cell when turned off, the data writing circuit is configured to write first data and correction data to the memory cell, and the data reading circuit is configured to read a first voltage value corresponding to the first data, read a second voltage value corresponding to the correction data after reading the first voltage value, convert a difference voltage value between the first and second voltage values into corrected first data, and output the corrected first data to the data writing circuit.

2. The semiconductor device according to claim 1, further comprising:

a reading bit line electrically connected to the memory cell and the data reading circuit;

a third transistor; and a fixed potential line, wherein:

the third transistor is configured to control a conductive state between the reading bit line and the fixed potential line, and the third transistor is on in a period other than periods during which the first and second voltage values are read.

3. The semiconductor device according to claim 1, wherein a channel formation region of the first transistor includes an oxide semiconductor.

4. The semiconductor device according to claim 1, wherein:

the memory cell further comprises a fourth transistor, and the fourth transistor is on in a period during which the first data and the correction data are read.

5. The semiconductor device according to claim 4, wherein the data writing circuit is configured to write the correction data to the memory cell in the period.

6. The semiconductor device according to claim 1, wherein:

the data reading circuit comprises:

a capacitor comprising first and second electrodes;

a potential control circuit; and an analog/digital converter circuit, the first electrode is electrically connected to the memory cell, the second electrode is electrically connected to the potential control circuit and the analog/digital converter circuit, and the potential control circuit is configured to set a potential of the second electrode to a fixed potential in a period during which the first voltage value is read, and bring the potential of the second electrode into an electrically floating state in a period during which the second voltage value is read.

7. An electronic component comprising the semiconductor device according to claim 1, and a lead electrically connected to the semiconductor device.

8. An electronic device comprising the electronic component according to claim 7, a printed circuit board provided with the electronic component, and a housing where the printed circuit board is stored.

9. A method for driving a semiconductor device, the semiconductor device comprising:

a data writing circuit;

a data reading circuit; and a memory cell, and the method comprising:

writing a first voltage value corresponding to first data from the data writing circuit to the memory cell;

reading the first voltage value from the memory cell to the data reading circuit;

writing a second voltage value corresponding to correction data from the data writing circuit to the memory cell, after reading the first voltage value;

reading the second voltage value from the memory cell to the data reading circuit;

converting a difference voltage value between the first and second voltage values into corrected first data; and outputting the corrected first data to the data writing circuit.

10. The method according to claim 9, wherein:

the memory cell comprises first and second transistors electrically connected to each other, and the first transistor holds charge corresponding to data retained in the memory cell when turned off.

11. The method according to claim 10, wherein a channel formation region of the first transistor includes an oxide semiconductor.

12. The method according to claim 9, wherein:

the semiconductor device further comprises:

a reading bit line electrically connected to the memory cell and the data reading circuit;

a third transistor; and a fixed potential line, the third transistor controls a conductive state between the reading bit line and the fixed potential line, and the third transistor is on in a period other than periods during which the first and second voltage values are read.

13. The method according to claim 9, wherein:

the memory cell further comprises a fourth transistor, and the fourth transistor is on in a period during which the first data and the correction data are read.

14. The method according to claim 13, wherein the step of writing the correction data from the data writing circuit to the memory cell is performed in the period.

15. The method according to claim 9, wherein:

the data reading circuit comprises:

a capacitor comprising first and second electrodes;

a potential control circuit; and an analog/digital converter circuit, the first electrode is electrically connected to the memory cell, the second electrode is electrically connected to the potential control circuit and the analog/digital converter circuit, and the potential control circuit sets a potential of the second electrode to a fixed potential in a period during which the first voltage value is read, and brings the potential of the second electrode into an electrically floating state in a period during which the second voltage value is read.

* * * * *